(12) United States Patent
Kim et al.

(10) Patent No.: US 10,727,435 B2
(45) Date of Patent: Jul. 28, 2020

(54) FLEXIBLE DISPLAY DEVICE AND ELECTRONIC DEVICE INCLUDING THE SAME

(71) Applicant: LG Display Co., Ltd., Seoul (KR)

(72) Inventors: Jun-Hyung Kim, Seoul (KR); Tae-Woo Kim, Paju-si (KR); Jung-Kyu Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 36 days.

(21) Appl. No.: 16/046,770

(22) Filed: Jul. 26, 2018

(65) Prior Publication Data

US 2019/0036068 A1 Jan. 31, 2019

(30) Foreign Application Priority Data

Jul. 28, 2017 (KR) .......................... 10-2017-0096363

(51) Int. Cl.
*H05K 5/00* (2006.01)
*H01L 51/52* (2006.01)
(Continued)

(52) U.S. Cl.
CPC ........ *H01L 51/5237* (2013.01); *G06F 1/1601* (2013.01); *G06F 1/1641* (2013.01);
(Continued)

(58) Field of Classification Search
CPC ......... G06F 1/1652; G06F 2203/04102; G06F 1/1641; G06F 1/1643; G06F 3/0412; G06F 1/1615; G06F 3/147; G06F 1/1647; G06F 2203/04803; G06F 3/046; G06F 1/1624; G06F 3/03547; G06F 3/0416; G06F 1/1601; G06F 1/1616; G06F 1/1677; G96F 1/16; G09F 9/30; G09F 9/301; H01L 51/00; H01L 51/0097; H01L 2251/5338; H05K 5/0017; H05K 5/0226; H05K 5/0086; H05K 1/147; H05K 1/028; H05K 9/0054; H05K 2201/056
See application file for complete search history.

(56) References Cited

U.S. PATENT DOCUMENTS 9,588,549 B2 * 3/2017 Endo ..................... G06F 1/1652
2010/0265668 A1 * 10/2010 Yuen ......................... G09F 7/04
361/736

(Continued)

FOREIGN PATENT DOCUMENTS

JP 2015-72465 A 4/2015
KR 10-2015-0105132 A 9/2015
(Continued)

OTHER PUBLICATIONS

Great Britain Search Report dated Jan. 25, 2019, for Great Britain Application No. 1812290.3, 5 pages.

*Primary Examiner* — Duc Q Dinh
(74) *Attorney, Agent, or Firm* — Seed IP Law Group LLP

(57) ABSTRACT

A flexible display device and an electronic device including the same are disclosed. The flexible display device includes a magnetic body group, which is adhered to a lower plate provided under a display panel by the force of magnetic attraction. Therefore, the flexible display device has improved reliability in spite of frequent folding and unfolding operations and is capable of facilitating a rework process.

18 Claims, 14 Drawing Sheets

(51) Int. Cl.
  *H05K 5/02* (2006.01)
  *H05K 1/14* (2006.01)
  *H05K 1/02* (2006.01)
  *G06F 1/16* (2006.01)
  *H01L 51/00* (2006.01)
  *H05K 9/00* (2006.01)
  *H01L 27/32* (2006.01)

(52) U.S. Cl.
  CPC ........... *G06F 1/1652* (2013.01); *H05K 1/028* (2013.01); *H05K 1/147* (2013.01); *H05K 5/0017* (2013.01); *H05K 5/0086* (2013.01); *H05K 5/0226* (2013.01); *G06F 2203/04102* (2013.01); *H01L 27/323* (2013.01); *H01L 27/3244* (2013.01); *H01L 51/0097* (2013.01); *H01L 2251/5338* (2013.01); *H05K 9/0054* (2013.01); *H05K 2201/056* (2013.01)

(56) References Cited

U.S. PATENT DOCUMENTS

| | | | |
|---|---|---|---|
| 2015/0382446 A1* | 12/2015 | Kwon | H05K 1/028 174/251 |
| 2016/0357052 A1* | 12/2016 | Kim | G02F 1/133305 |
| 2017/0023985 A1 | 1/2017 | Xin et al. | |
| 2017/0075459 A1 | 3/2017 | Kauhaniemi et al. | |
| 2018/0070460 A1* | 3/2018 | Han | G06F 1/1652 |
| 2018/0107250 A1* | 4/2018 | Cho | H01L 51/0097 |

FOREIGN PATENT DOCUMENTS

| | | |
|---|---|---|
| KR | 10-2016-0112090 A | 9/2016 |
| KR | 10-2016-0139826 A | 12/2016 |
| KR | 10-2016-0141059 A | 12/2016 |
| KR | 10-2017-0017404 A | 2/2017 |
| KR | 10-2017-0029162 A | 3/2017 |
| KR | 10-1720178 B1 | 3/2017 |

* cited by examiner

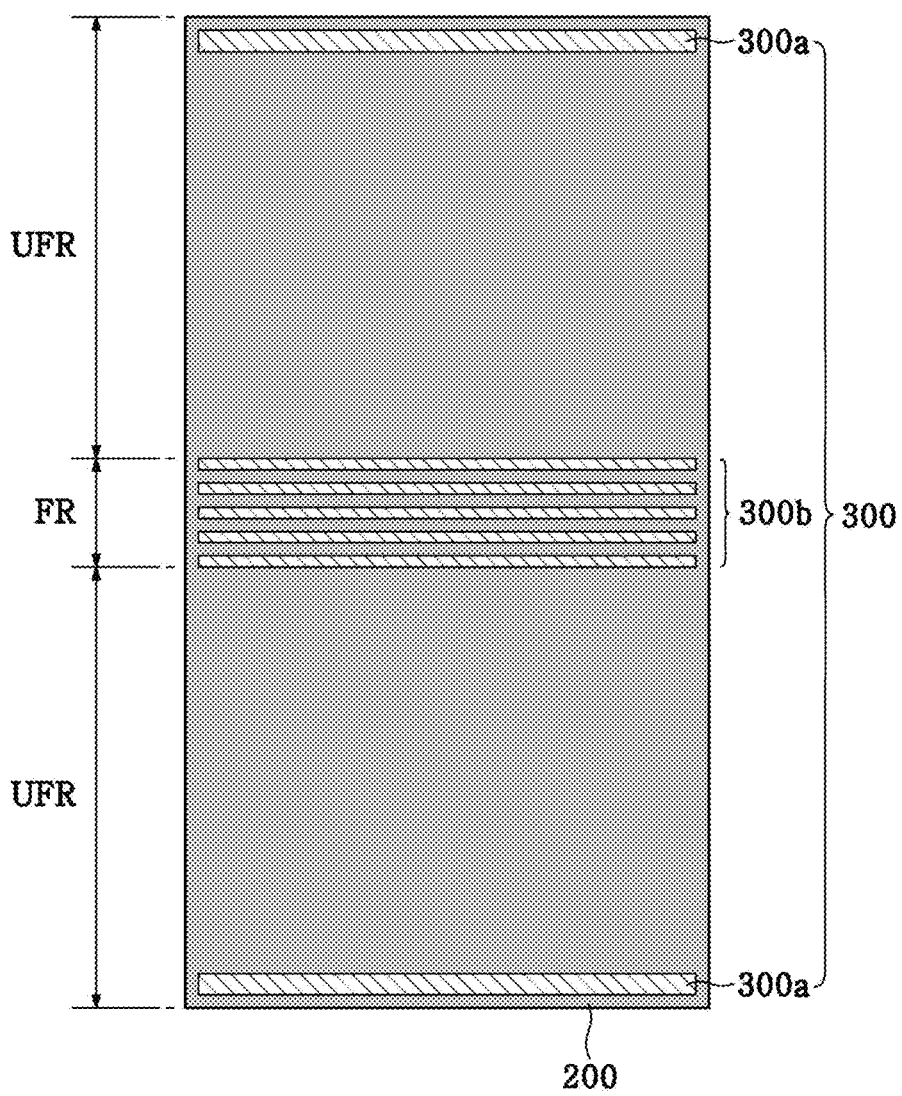

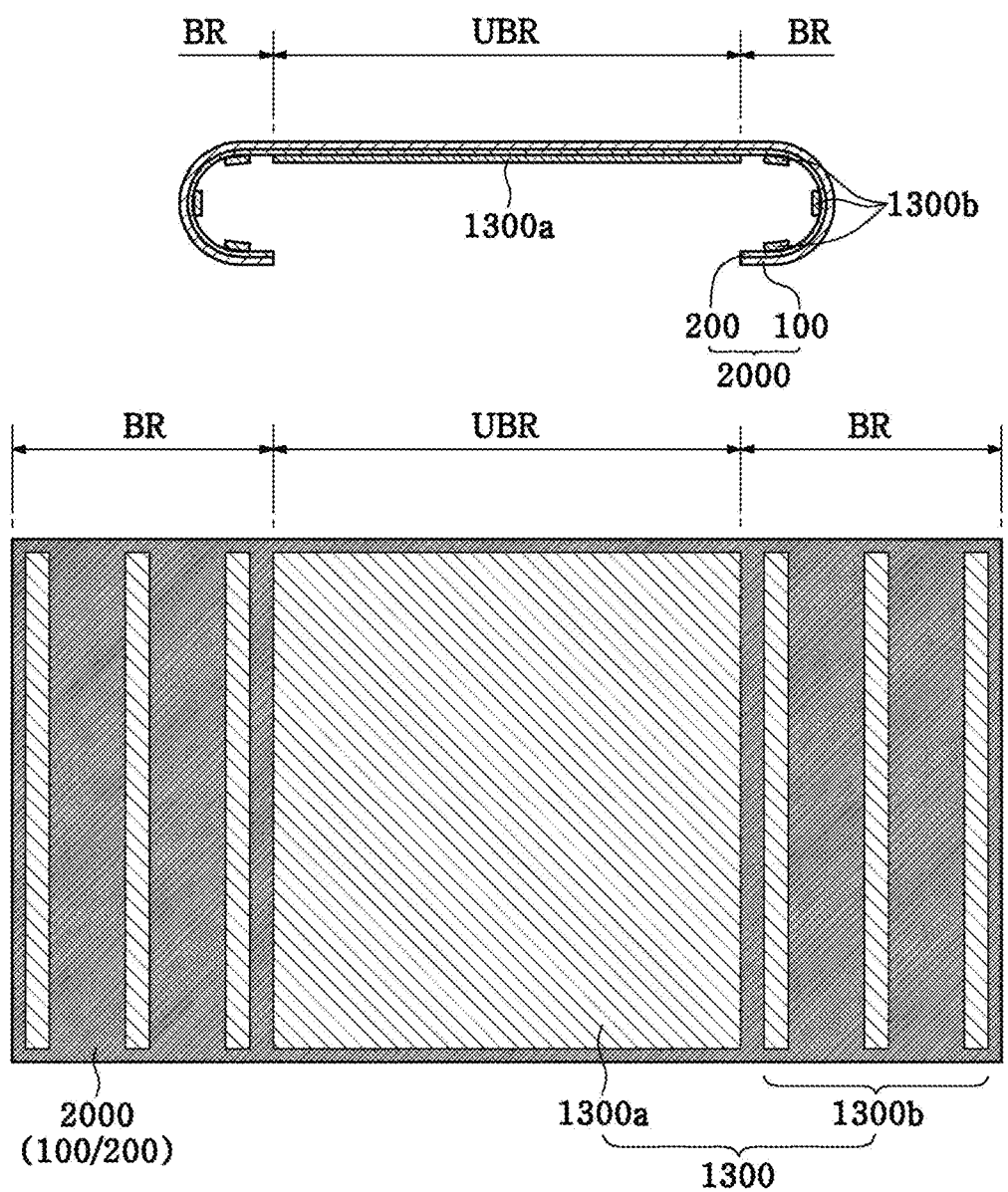

FLEXIBLE DISPLAY DEVICE AND ELECTRONIC DEVICE INCLUDING THE SAME

CROSS-REFERENCE TO RELATED APPLICATION(S)

This application claims the benefit of Korean Patent Application No. 10-2017-0096363, filed on Jul. 28, 2017, which is hereby incorporated by reference as if fully set forth herein.

BACKGROUND

Technical Field

The present disclosure relates to a flexible display device, and more particularly to a flexible display device that has improved reliability in spite of frequent folding and unfolding operations and facilitates a rework process and to an electronic device including the same.

Description of the Related Art

An image display device, which realizes various pieces of information on a screen, is a core technology of the information and communication age, and is being developed in the direction of becoming thinner, lighter, more portable, and having higher performance. As a flat panel display device that is capable of overcoming the problems of disadvantageous weight and volume of a cathode ray tube (CRT), for example, an organic light-emitting display device, which uses a self-illuminating organic light-emitting element and therefore does not require a separate light source, is attracting attention.

Such an organic light-emitting display device displays an image using a plurality of pixels, which are arranged in a matrix form. Here, each pixel includes a light-emitting element and a pixel drive circuit having multiple transistors that implement independent driving of the light-emitting element.

Recently, in terms of various applications, there is increasing demand for flexible display devices, which can be conveniently carried in a pocket or purse and which can display an image on a larger screen than when being carried. A flexible display device is maintained in a folded or bent state when being carried or stored, and is unfolded in order to display an image, whereby an image display region increases, the aesthetic appearance of the device is improved, and a more realistic image is provided to a user.

A display panel for displaying an image may be made slim by reducing the thickness of a substrate. In order to protect the display panel from external moisture, stimulation or physical shocks, the display panel needs to be accommodated in a case structure. In general, the display panel and the case structure are formed of different materials from each other, and the display panel and other components are accommodated together in the case structure. Because the case structure serves to accommodate various components, the size thereof is different from that of the display panel. Further, the thickness of the case structure may vary depending on whether components accommodated therein overlap each other. The display panel and the case structure are manufactured in different processes from each other, and are assembled with each other. Therefore, an adhesive member is provided between the display panel and the case structure in order to prevent the display panel and the case structure from being separated from each other due to vibration or shocks.

However, in the case of a flexible display device in which an adhesive member is provided at a folding region, the display panel may be undesirably bent, or the adhesive member may peel off from the folding region. In order to prevent this problem, an adhesive member is removed from the folding region.

However, in the case of a flexible display device in which an adhesive member is removed from the folding region, force of supporting the folding region is decreased. Thus, upon returning to the unfolded state from the folded state, the display panel does not become completely flat.

In flexible display devices developed to date, after repeated folding and unfolding operations, the folding region is separated from other regions, and is therefore visible from the outside, leading to deterioration in the aesthetic appearance of the device.

BRIEF SUMMARY

Accordingly, the present disclosure is directed to a flexible display device and an electronic device including the same that substantially obviate one or more problems due to limitations and disadvantages of the related art.

The present disclosure o provides a flexible display device that is capable of stably supporting a display panel in spite of repeated folding and unfolding operations, preventing damage to the display panel during a rework process, and facilitating mounting of the display panel in a case.

The present disclosure provide an electronic device including the above flexible display device.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with the disclosure, as embodied and broadly described herein, a flexible display device includes a lower plate, which is provided under a display panel and has predetermined stiffness, and an magnetic body group, which is kept in direct contact with the bottom surface of the lower plate without any adhesive member therebetween.

In an aspect of the present disclosure, a flexible display device includes a display panel, a lower plate formed of steel use stainless, the lower plate including one surface facing the bottom surface of the display panel, the lower plate being divided into at least one folding region and a non-folding region adjacent to the folding region, the folding region having a density lower than the density of the non-folding region, and a magnetic body group divided in accordance with the folding region and the non-folding region, the magnetic body group being kept in contact with the opposite surface of the lower plate.

The magnetic body group may include a single magnetic body provided in the non-folding region and at least two magnetic bodies provided in the folding region. The magnetic body in the non-folding region and the at least two magnetic bodies may be separated from each other.

The magnetic body provided in the non-folding region and the at least two magnetic bodies provided in the folding region may be kept in surface contact with the lower plate, and the contact area between the at least two magnetic bodies provided in the folding region and the lower plate at a folded state may be smaller than that at an unfolded state.

The magnetic body provided in the non-folding region and the at least two magnetic bodies provided in the folding region may include flat surfaces so as to correspond to the lower plate.

The flexible display device may further include an adhesive layer provided between the display panel and the non-folding region of the one surface of the lower plate.

The lower plate may include a plurality of slits formed in the folding region.

The plurality of slits may be arranged in a plurality of rows and a plurality of columns, the rows being parallel to the folding axis, and the plurality of slits formed in the rows arranged adjacent to each other may not partially overlap each other when viewed in a column direction.

At least one of the slits formed in the folding region of the lower plate may be formed to a depth that is less than the thickness of the non-folding region of the lower plate.

The flexible display device may further include a metal film provided on the opposite surface of the lower plate that faces the magnetic body group, the metal film being brought into direct contact with the magnetic body group.

Each of the at least two magnetic bodies provided in the folding region may be configured as a single body that continuously extends long in the folding-axis direction.

The magnetic body group may occupy an area that is more than 10% of the entire area of the non-folding region of the lower plate.

The flexible display device may further include a housing member for accommodating the lower plate and the magnetic body group therein. The housing member may be bonded to the bottom surface of the magnetic body group using an adhesive member.

The housing member may include a plurality of segments provided corresponding to the folding region, the segments extending in the folding-axis direction, and the magnetic body group may be divided into the magnetic bodies in accordance with the segments.

The flexible display device may further include a board provided between the magnetic body group and the housing member so as to correspond to the non-folding region.

The magnetic body group may be formed of magnet steel.

The flexible display device may further include a flexible printed circuit board connected to one side of the display panel, the flexible printed circuit board extending so as to be folded between the housing member and the magnetic body group, a printed circuit board connected with the flexible printed circuit board, and a battery connected with the printed circuit board, the battery being located between the housing member and the magnetic body group.

The display panel may include a flexible base substrate, a thin-film transistor array provided on the flexible base substrate, an organic light-emitting diode array connected with the thin-film transistor array, an encapsulation layer for encapsulating the organic light-emitting diode array, a touch electrode array provided on the encapsulation layer, and a cover layer for protecting the touch electrode array.

In another aspect of the present disclosure, an electronic device includes a display panel, a lower plate formed of steel use stainless, the lower plate including one surface facing the bottom surface of the display panel, the lower plate being divided into at least one folding region and a non-folding region adjacent to the folding region, the folding region having a density lower than the density of the non-folding region, a magnetic body group divided in accordance with the folding region and the non-folding region, the magnetic body group being kept in contact with the opposite surface of the lower plate, a housing member for accommodating the lower plate and the magnetic body group therein, the housing member being divided in accordance with the non-folding region and the folding region so as to independently operate in accordance therewith, a flexible printed circuit board connected to one side of the display panel, the flexible printed circuit board extending so as to be folded between the housing member and the magnetic body group, a printed circuit board connected with the flexible printed circuit board, the printed circuit board being located between the housing member and the magnetic body group, and a battery connected with the printed circuit board, the battery being located between the housing member and the magnetic body group.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 9A to 9C are plan views illustrating various embodiments of magnetic bodies, which are brought into contact with the lower plate, in the flexible display device according to the present disclosure;

FIG. 16 is a view illustrating a magnetic body group and components disposed thereon in a bendable display device according to a second embodiment of the flexible display device of the present disclosure.

DETAILED DESCRIPTION

Figure 1:
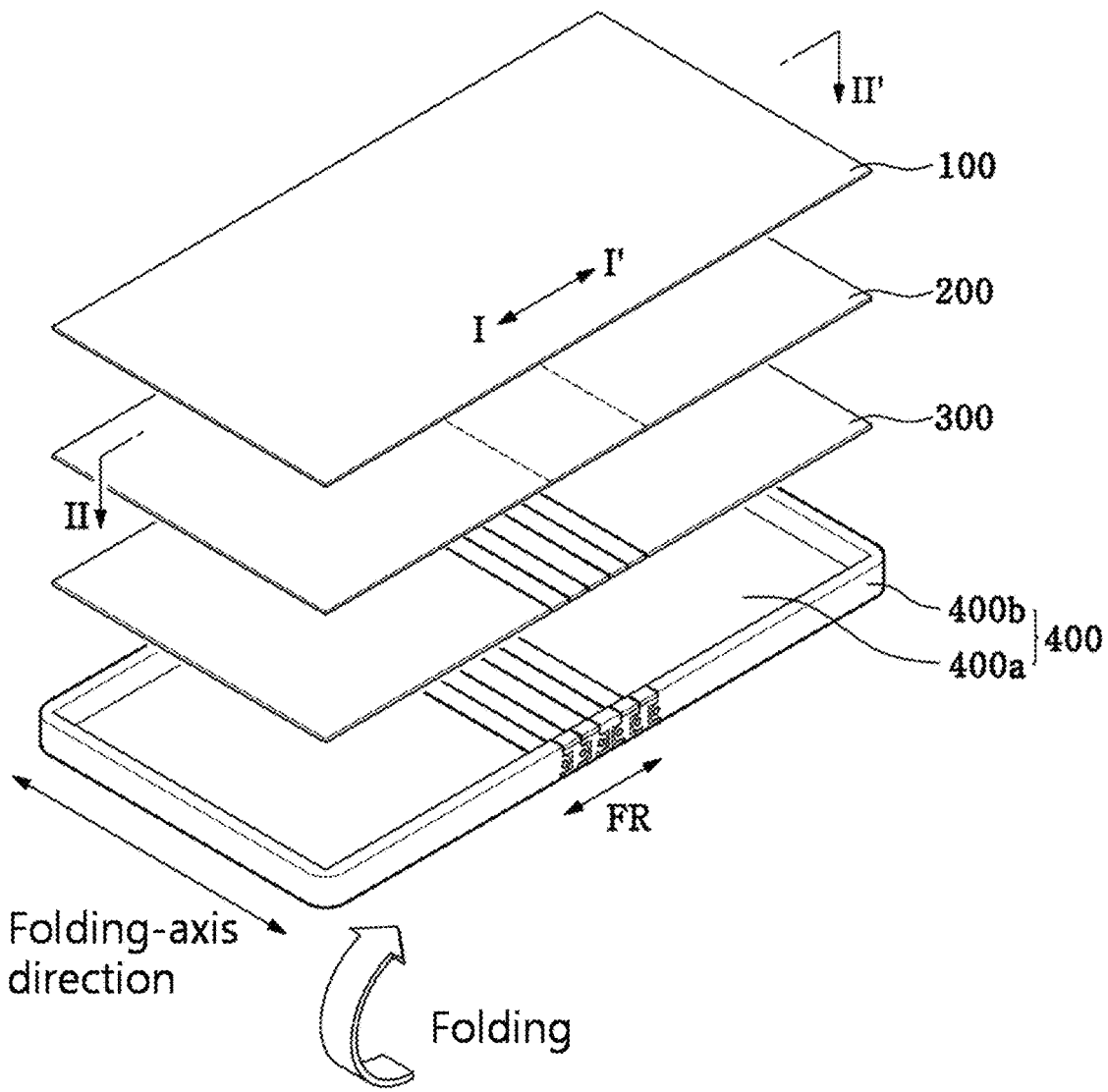
FIG. 1 is an exploded perspective view of a flexible display device according to a first embodiment of the present disclosure.

Reference will now be made in detail to the preferred embodiments of the present disclosure, examples of which are illustrated in the accompanying drawings. In the drawings, the same or similar elements are denoted by the same reference numerals even though they are depicted in different drawings. In the following description of the present disclosure, a detailed description of known functions and configurations incorporated herein will be omitted when it may obscure the subject matter of the present disclosure. Before explaining embodiments of the present disclosure, it is to be understood that the phraseology and terminology used in the following specification and appended claims should not be construed as being limited to general and dictionary meanings, but should be construed as meanings and concepts according to the spirit of the present disclosure on the basis of the principle that the inventor is permitted to define appropriate terms for the best explanation.

It will be understood that, when an element such as a layer, film, region or substrate is referred to as being "on" another element, it can be directly on the other element, or intervening elements may also be present. On the other hand, when an element such as a layer, film, region or substrate is referred to as being "directly on" another element, this means that there are no intervening elements therebetween.

In addition, in the drawings, for more clear explanation, the dimensions of elements, such as the thickness, width, or the like, may be exaggerated or reduced, and thus the thickness, width, or the like of the present disclosure is not limited to the illustration of the drawings.

Hereinafter, exemplary embodiments of the present disclosure will be described with reference to the drawings.

The display devices according to embodiments set forth herein may be a foldable display device, the center of which is foldable, or a bendable display device, which is bendable in both directions. However, any portion of the display device may be configured to be foldable or bendable. In the flexible display device according to the present disclosure, a lower plate and a magnetic body, which are folded together upon an operation of folding the folding region, may be changed in position in accordance with the arrangement of the folding region of the display device. The flexible display device according to the present disclosure may be referred to as various names such as a foldable display device, a bendable display device, a rollable display device, etc., as long as the device is configured to be flexible.

Figure 2:
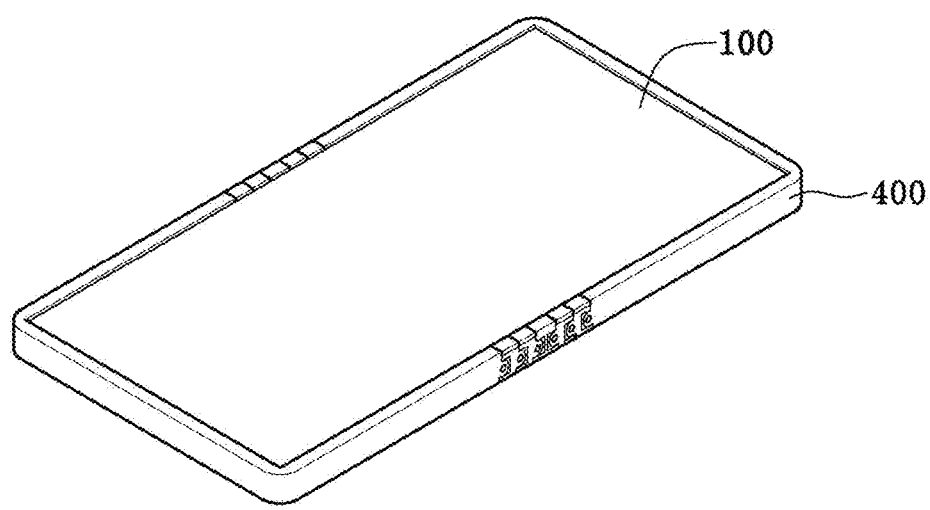
FIG. 2 is a perspective view illustrating the coupled state of the flexible display device shown in FIG. 1.
Figure 3:
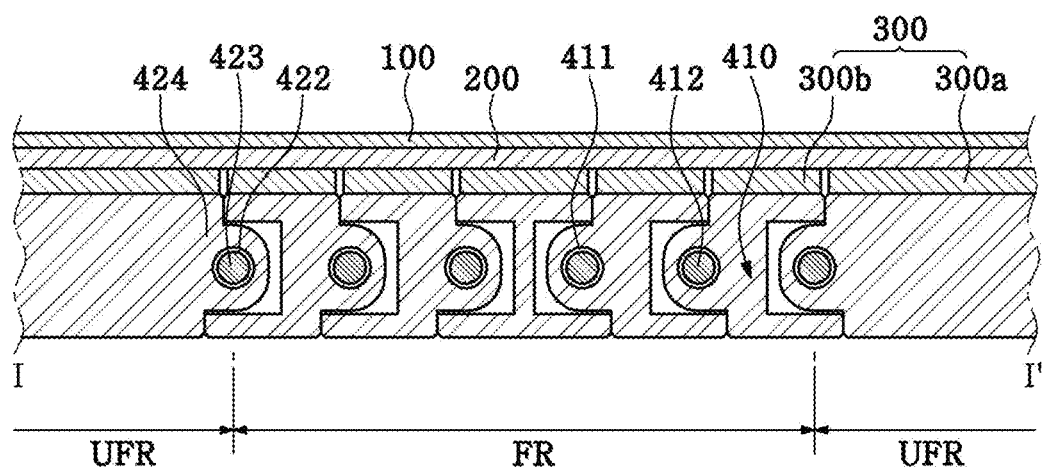
FIG. 3 is a cross-sectional view taken along line I-I' in the unfolded state of the flexible display device shown in FIG. 1.
Figure 4:
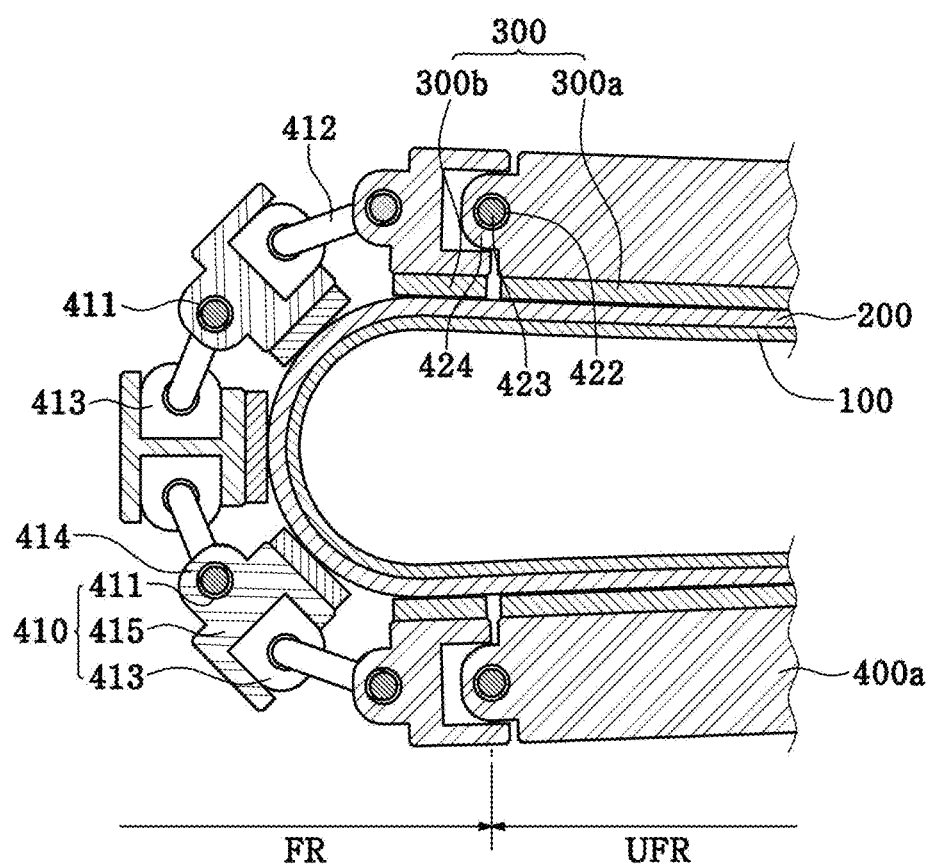
FIG. 4 is a cross-sectional view taken along line I-I' in the state in which the flexible display device shown in FIG. 1 is folded in half about a folding axis.

FIG. 1 is an exploded perspective view of a flexible display device according to a first embodiment of the present disclosure. FIG. 2 is a perspective view illustrating the coupled state of the flexible display device shown in FIG. 1. FIG. 3 is a cross-sectional view taken along line I-I' in the unfolded state of the flexible display device shown in FIG. 1. FIG. 4 is a cross-sectional view taken along line I-I' in the state in which the flexible display device shown in FIG. 1 is folded in half about a folding axis.

As shown in FIGS. 1 to 4, the flexible display device according to the first embodiment of the present disclosure includes a display panel 100, a lower plate 200, a magnetic body group 300, and a housing member 400, which are sequentially arranged from the top. This flexible display device according to the first embodiment of the present disclosure, as shown in FIGS. 1 to 4, is a foldable display, which can be folded such that a region thereof extending along line II-IF is folded in half about the folding axis.

Due to the volumes of the display panel 100, the lower plate 200, the magnetic body group 300 and the housing member 400, the flexible display device is not completely folded flat in half, but rather is folded such that a folding region FR thereof, which has a predetermined area, is folded to form a C-shaped curve, as shown in FIG. 4.

Here, the top surface of the display panel 100 shown in FIGS. 1 to 3 is the top surface of the flexible display device, which is exposed to the outside and is a display surface, and the bottom surface of a base panel 400a of the housing member 400 is the bottom surface of the flexible display device, through which the housing member 400 or another system cover (not shown) is observed.

The flexible display device is illustrated as being formed in an approximately rectangular shape. However, this is merely illustrative, and the present disclosure is not limited thereto. The four corners of the flexible display device may be formed to be rounded. The flexible display device may be formed in a polygonal shape, rather than a rectangular shape, or in a circular shape. The shapes of the display panel 100, the lower plate 200, the magnetic body group 300 and the housing member 400 may be determined in accordance with the desired shape of the flexible display device. The display panel 100, the lower plate 200, the magnetic body group 300 and the base panel 400a of the housing member 400 may be approximately the same size.

Here, "folding region FR" refers to a region that is formed to be foldable, and "non-folding region UFR" refers to a region that is formed to be non-foldable. The shapes of the lower plate 200, the magnetic body group 300 and the housing member 400 may vary in accordance with the formation type of the folding region FR and the non-folding region UFR of the flexible display device according to the present disclosure. The illustrated first embodiment is a foldable display, in which the folding region FR is disposed at the center portions of the display panel 100 and the lower plate 200.

The display panel 100 is a panel that performs display independently. In order to maintain flexibility, a flexible base substrate 112 (refer to FIG. 6), on which a thin-film transistor array 1100 (refer to FIG. 12) is disposed, may be configured as a flexible plastic film or an organic substrate. The flexible base substrate 112 has a thickness ranging from about 3 μm to about 100 μm. The overall thickness of the display panel 100, including the array configuration formed on the flexible base substrate 112, ranges from about 5 μm to about 300 μm, whereby any portion of the display panel 100 may be folded or bent. However, the folding region FR may be defined as a specific region in accordance with conditions required for the finished flexible display device. The folding region FR of each of the components (the lower plate 200, the magnetic body group 300 and the housing member 400) other than the display panel 100 may be specified so as to have an individual configuration in accordance with the specification required for each of the components. In order to ensure sufficient flexibility and prevent damage to the array upon the folding operation, the display panel 100 may also include a flexible base substrate 112 as needed, of which the array configuration or the surface structure in the folding region FR is different from that in the non-folding region UFR.

Figure 5:
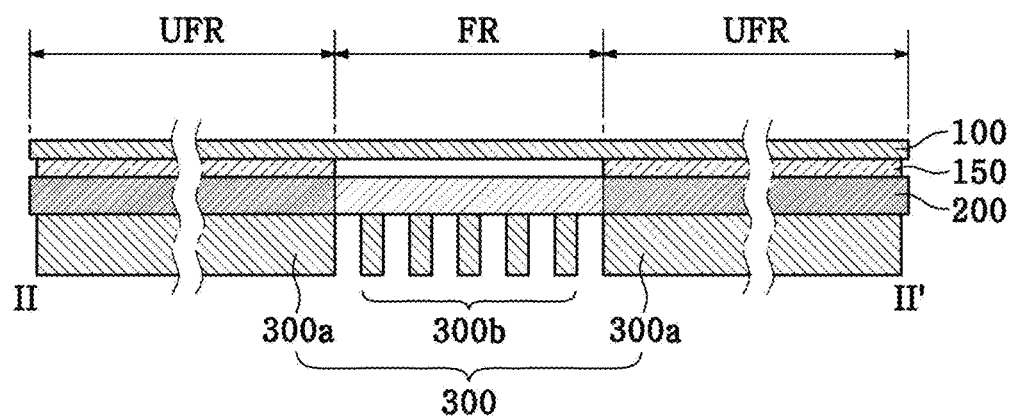
FIG. 5 is a cross-sectional view of a flexible display device according to another embodiment of the present disclosure, which is taken along line II-IF in FIG. 1.

The lower plate 200 includes a folding region FR and a non-folding region UFR. The lower plate 200 is configured as a steel use stainless (SUS, it is also represented as 'stainless steel') plate. The lower plate 200 is arranged such that one surface thereof faces the bottom surface of the display panel 100. That is, the display panel 100 and the lower plate 200 overlap each other with the surfaces thereof in contact with each other, whereby the display panel 100 and the lower plate 200 are operated together upon the folding or unfolding operation. As shown in FIG. 5, an adhesive layer 150 may be provided between the display panel 100 and the lower plate 200. Alternatively, the adhesive layer 150 may be omitted. In the case in which the adhesive layer 150 is not provided, the display panel 100 and the lower plate 200 may be in contact with each other without a gap therebetween, or an air gap of 10 μm or less may be present therebetween.

The reason for forming the lower plate 200 using steel use stainless (SUS) is to assure sufficient stiffness and flexibility in spite of the small thickness thereof. Steel use stainless is a material that has a modulus greater than the modulus of an insulation film provided in the flexible base substrate 112 and the array configuration, which are included in the display panel 100. In general, a modulus is a coefficient that expresses stiffness. A smaller modulus indicates higher elasticity, and a larger modulus indicates lower elasticity and higher stiffness, i.e., a property of maintaining an original state. A Young's modulus may be measured, and the measured value may be used.

The lower plate 200 includes a plurality of slits 202 (refer to FIG. 7) formed in the folding region FR, whereby the density (or unit gravity) of the folding region FR may be decreased below that of the non-folding region UFR. The reason for forming the slits in the folding region FR of the lower plate 200 is as follows. The folding region FR repeatedly undergoes stress during the folding operation. If the folding region FR is formed to have a mass ratio (or unit gravity) equivalent to that of the non-folding region UFR, it may take a long time for the folding region FR to be restored to its original state after being folded. The aforementioned slits are formed in order to enable the folding region FR to be rapidly restored to its original state after being folded. That is, in order to assure sufficient stiffness of the lower plate 200 and rapid restoration to the original state thereof after being folded, the slits 202 are formed in the folding region FR of the lower plate 200 such that the mass ratio of the folding region FR is lower than that of the non-folding region UFR. The slits 202 may be formed through the entire thickness of the folding region FR of the lower plate 200, or may be formed to a predetermined depth within the entire thickness of the folding region FR of the lower plate 200. The slits may be arranged at regular intervals in the entire area of the folding region FR. The slits may be arranged such that the arrangement density thereof gradually increases or decreases from the center of the folding region FR to the edge thereof.

In either case, the slits 202 are located in the folding region FR of the lower plate 200. The lower plate 200 is not split into plural pieces by the slits, but is configured as a single plate that corresponds to the display panel 100.

Metal films 211 and 213 (refer to FIGS. 8A to 8D) are provided on the surfaces of the lower plate 200 so as to be respectively brought into contact with the display panel 100, which is disposed on the lower plate 200, and the magnetic body group 300, which is disposed under the lower plate 200.

The magnetic body group 300 may include a first magnetic body 300*a*, which corresponds to the non-folding region UFR, and a second magnetic body 300*b*, which corresponds to the folding region FR. The first and second magnetic bodies 300*a* and 300*b* may be brought into contact with the bottom surface of the lower plate 200 by the force of magnetic attraction. The first magnetic body 300*a* and the second magnetic body 300*b* may be formed to be the same thickness as each other without any difference in height therebetween. Each of the first magnetic body 300*a* and the second magnetic body 300*b* may be formed to have a thickness ranging from about 0.3 mm to about 5 mm in order to have sufficient stiffness and stably support the lower plate 200. The magnetic body group 300 is configured such that the first magnetic body 300*a* is disposed in each of the non-folding regions UFR located on both sides of the folding region FR and has a single plate configuration and such that the second magnetic body 300*b* is disposed in the folding region FR and is split into more than one piece.

The second magnetic body 300*b*, which is provided in the folding region FR of the magnetic body group 300, may be split in accordance with the split configuration of the housing member 400, which is disposed under the magnetic body group 300. Each of the magnetic body group 300 and the housing member 400 may be formed to have a thickness and stiffness greater than the thickness and stiffness of the display panel 100 or the lower plate 200 in order to maintain the shapes thereof. The reason for forming the housing member 400 and the second magnetic body 300*b* so as to have a split configuration in the folding region FR is as follows. Unlike the lower plate 200, the second magnetic body 300*b* is not flexible, and thus, as shown in FIG. 4, the second magnetic body 300*b* remains flat even during the folding operation. Therefore, the second magnetic body 300*b* is split into a plurality of pieces so that the contact area between the second magnetic body 300*b* and the lower plate 200 is minimized when the folding region FR is folded with a large curvature. As shown in FIGS. 3 and 4, each of the first and second magnetic bodies 300*a* and 300*b*, which constitute the magnetic body group 300, has flat top and bottom surfaces, which respectively face the lower plate 200 and the housing member 400. Therefore, in the initial unfolded state, the first and second magnetic bodies 300*a* and 300*b* are kept in surface contact with the lower plate 200 and the housing member 400.

Segments 410 of the housing member 400 that are located in the folding region FR are formed separately from each other. Therefore, even when the housing member 400 is folded such that the radius R of curvature at a portion thereof that is relatively distant from the flexible lower plate 200 and the radius R of curvature at a portion thereof that is relatively close to the flexible lower plate 200 are different from each other, the segments 410 may be arranged in a manner such that the top surfaces thereof are arranged close to each other and the bottom surfaces thereof are arranged distant from each other. That is, during the folding operation, the segments 410 of the housing member 400 may be capable of withstanding any variation in the shape of the device.

When the device is switched from the folded state to the unfolded state, as shown in FIG. 3, the segments 410 may be restored to their original state, in which the distance between the top surfaces and the distance between the bottom surfaces of the adjacent segments 410 are equal to each other.

In the flexible display device according to the first embodiment of the present disclosure, the folding region FR of the housing member 400 is split into five segments 410. Each of the segments 410 may be formed in a single linear configuration that continuously extends long in the folding-axis direction. Although it is illustrated in the drawings that the folding region FR of the housing member 400 is split into five segments 410, the present disclosure is not limited thereto. The number of segments may vary depending on the curvature formed upon the folding operation. When the display panel 100 is folded, a predetermined space is formed between the upper portion of the folded display panel 100 and the lower portion of the folded display panel 100, which face each other. The smaller the aforementioned space, the more precisely the folding operation is realized. To this end, the number of segments may be further increased. The reason for providing a plurality of segments 410 (e.g., five segments) in the folding region FR of the housing member 400 is to enable the folding region FR of the housing member 400, which has greater stiffness than other components, to be folded in a gentle curve. As shown in FIG. 4, the five segments 410 are connected to each other using springs 412, which expand upon the folding operation. Each of the segments 410 includes a body 415, which has holes 411 formed in left and right portions thereof. The portion of the body 415 in which the hole 411 is formed may have a protruding configuration (a convex portion 414) or an indented configuration (a concave portion 413). In the unfolded state, as shown in FIG. 3, the adjacent segments 410 are arranged such that the hole 411 formed in the concave portion 413 of one of the segments 410 and the hole 411 formed in the convex portion 414 of the other one overlap each other and such that the spring 412 inserted into the holes 411 is in the most compressed state. When tensile force is applied to the segments 410 during the folding operation, as shown in FIG. 4, the spring 412 expands, and the concave portion 413 of one of the adjacent segments 410 and the convex portion 414 of the other one are therefore separated from each other. Among the segments 410, the segment 410 that is located at the center (the center of the C-shaped configuration when viewed in FIG. 4) includes concave portions 413, which are formed at both sides of the body 415, and each of the remaining segments 410 includes a concave portion 413, which is formed at one side of the body 415, and a convex portion 414, which is formed at the opposite side of the body 415. Through this configuration, the springs 412 are coupled to the segments 410 so as to be symmetrical in the transverse direction on the basis of the center of the folding region FR. However, the present disclosure is not limited thereto. All of the segments 410 may have the same configuration as each other such that the concave portion 413 is formed at one side of the body and the convex portion 414 is formed at the opposite side of the body. That is, the positions of the concave portion 413 and the convex portion 414, which are formed symmetrically in each of the segments 410, correspond to the positions of the concave portion and the convex portion in the other segment. Therefore, all of the segments 410 have the same coupling structure between the springs 412 and the holes 411.

In the unfolded state, the concave portion 413 of one of the adjacent segments 410 and the convex portion 414 of the other one overlap each other, and the spring 412 is in the most compressed state. In the folded state, the adjacent segments 410 are separated from each other, and the spring 412 expands from the hole 411 formed in the concave portion 413.

The surface of the body 415 of each of the segments 410, which faces the lower plate 200, is formed flat. The second magnetic body 300b is disposed between the flat surface of each of the segments 410 and the lower plate 200. In the unfolded state, as shown in FIG. 3, the second magnetic body 300b and the lower plate 200 are adhered to each other by the force of magnetic attraction applied between the entire upper surface area of the second magnetic body 300b and the lower plate 200. In the folded state, the contact area between the second magnetic body 300b and the lower plate 200 varies depending on the degree to which the lower plate 200 is bent. In the folded state, the second magnetic body 300b and the lower plate 200 are kept in at least line contact with each other in the folding-axis direction (the direction penetrating the drawing sheet).

As shown in FIG. 4, in the folded state, the display panel 100, which is located at the innermost position, is folded such that an upper non-folding region UFR and a lower non-folding region UFR face each other in the vertical direction. At this time, the length by which the folding region FR of each of the lower plate 200, the magnetic body group 300 and the housing member 400, which are located further outwards than the display panel 100, expands upon the folding operation gradually increases in the outward direction.

The lower plate 200, which is in surface contact with the display panel 100, has sufficient flexibility due to the slits 202 (refer to FIG. 7) formed in the folding region FR thereof, whereby it can be folded integrally with the display panel 100. The magnetic body group 300 and the housing member 400, which have relatively high stiffness, can be expanded upon the folding operation due to the segments 410, which are split in the folding region FR, and the springs 412 interconnecting the segments 410. The base panel 400a of the housing member 400, which is the non-folding region UFR of the housing member 400, includes a convex portion 424, which protrudes toward the segment 410 located adjacent thereto, a hole 422 formed in the convex portion 424, and a spring 423 coupled to the hole 422 and the hole 411 formed in the segment 410 located adjacent thereto. Through this configuration of the housing member 400, the base panel 400a and the segment 410 are connected to each other.

The second magnetic body 300b and the segments 410, which are split in the folding region FR of the housing 400, extend long in the folding-axis direction. The second magnetic body 300b and each of the segments 410 of the housing member 400 may be kept in contact with each other using an adhesive (not shown), and may therefore be operated together without becoming separated from each other upon the folding or unfolding operation.

The magnetic body group 300 and the lower plate 200 are adhered to each other by the force of magnetic attraction. In the unfolded (flat) state, as shown in FIG. 3, the magnetic body group 300 is in surface contact with the entire area of the lower plate 200. In the folded (bent) state, the second magnetic body 300b, which is provided in the folding region FR of the magnetic body group 300, is in contact with the smaller area of the lower plate 200 in the folding-axis direction than in the unfolded state. That is, the contact area between the second magnetic body 300b and the lower plate 200 gradually decreases when transitioning from the unfolded state to the folded state. This is because the lower plate 200 is relatively flexible and the folding region FR thereof is therefore bent like a circle upon the folding operation, whereas the second magnetic body 300b of the magnetic body group 300 has a strong property of maintaining its original shape due to the characteristics of the material thereof even under the stress generated during the folding operation. However, upon the folding operation, the second magnetic body 300b is not completely separated from the lower plate 200, but is kept in line contact with or in partial surface contact with the lower plate 200 in the folding-axis direction. Due to the at least line contact between the second magnetic body 300b and the lower plate 200, the contact between the magnetic body group 300 and the lower plate 200 is maintained without an additional adhesive upon the folding operation.

The magnetic body group 300 has a flat surface such that either the second magnetic body 300b in the folding region FR or the first magnetic body 300a in the non-folding region UFR has no protruding or depressed portion. The second magnetic body 300b and the first magnetic body 300a have different widths from each other, but have the same length as each other in the folding-axis direction.

The housing member 400 accommodates the lower plate 200 and the magnetic body group 300. As shown in FIG. 1, the housing member 400 may include the base panel 400a and side panels 400b, each of which has a height equal to or greater than the sum of the height of the lower plate 200 and the height of the magnetic body group 300, so that the lower plate 200 and the magnetic body group 300 are invisible from the outside. The housing member 400 may further include top panels (not shown) as needed, which extend inwards from the side panels 400b in order to cover the edges of the display panel 100. In this case, the top panels disposed at the four sides of the display panel 100 may have different configurations from each other. For example, each of the top panels of the housing member 400, which are disposed at the left side, the right side and the upper side of the display panel 100, may have a smaller width than the top panel of the housing member 400, which is disposed at the lower side of the display panel 100. In the case in which a flexible printed circuit board 610 (refer to FIG. 11) is provided at the lower side of the display panel 100, the flexible printed circuit board may be shielded by the top panel of the housing 400, which is disposed at the lower side of the display panel 100 and has a relatively large width.

Each of the segments 410, which are split in the folding region FR of the housing member 400, may be continuously formed throughout the base panel, the side panels and the top panels of the housing member 400. The segments 410 may be connected to each other and may be connected to the base panel 400a, which corresponds to the non-folding region of the housing member 400, using the springs 412 and 423. The springs 412 and 423 may be formed of a compressible material, such as rubber or the like.

In the flexible display device according to the present disclosure, the housing member 400, which includes the segments 410, may be formed of a material that has higher stiffness than the material of the lower plate 200, such as plastic, metal, or surface-treated metal.

In some cases, the flexible display device according to the present disclosure may further include a system cover, which is disposed outside the housing member 400 in order to improve the aesthetic appearance of the device or accommodate additional components. In this case, unlike the housing member 400, the system cover may be formed of a flexible material so as to be folded.

FIG. 5 is a cross-sectional view of a flexible display device according to another embodiment of the present disclosure, which is taken along line II-IF in FIG. 1.

As shown in FIG. 5, the flexible display device according to the other embodiment differs from the device shown in FIGS. 2 to 4 in that an adhesive layer 150 is provided between the non-folding region UFR of the display panel 100 and the non-folding region UFR of the lower plate 200.

That is, in the flexible display device according to the other embodiment of the present disclosure, the display panel 100 and the lower plate 200 may be bonded to each other by the adhesive layer 150, which is interposed between the surface of the display panel 100 and the surface of the lower plate 200 that face each other. In this case, the adhesive layer 150 may not be provided in the folding region FR, but may be provided only in the non-folding region UFR. This is for preventing the adhesive layer from peeling off from the folding region FR due to deterioration of bonding force between the two components attributable to repeated folding and unfolding operations.

The magnetic body group 300 (300a and 300b) is in contact with the lower plate 200 due to the force of magnetic attraction. In the unfolded state, the folding region FR of the magnetic body group 300 is in surface contact with the folding region FR of the lower plate 200 (refer to FIG. 3). In the folded state, the folding region FR of the magnetic body group 300 is in at least line contact with the folding region FR of the lower plate 200 (refer to FIG. 4). Therefore, the lower plate 200 and the magnetic body group 300 are kept in contact with each other without any adhesive member therebetween.

The magnetic body group 300 may be located further inwards than the edges of the display panel 100. Accordingly, when the magnetic body group 300, which is not used for display and has a larger thickness than the display panel 100 or the lower plate 200, is accommodated in the housing member 400 having no top panels, the magnetic body group 300 is shielded by the lower plate 200 or the display panel 100, which is disposed thereon. That is, in the flexible display device according to the present disclosure, the components disposed under the display panel 100 are invisible in any direction from the outside.

In either the flexible display device according to the first embodiment or the flexible display device according to another embodiment, when the display panel 100 is mounted on the housing member 400, the lower plate 200, which has a size equal or similar to the size of the display panel 100, is provided so as to face the surface of the display panel. Therefore, the lower plate 200, having relatively high stiffness, continues to support the display panel 100 so as to prevent the display panel 100 from drooping or being bent, thereby maintaining the stiffness and consequently improving the reliability of the device in spite of repeated folding and unfolding operations. Further, the portion of the lower plate 200, which corresponds to the folding region, is formed to have a relatively low density, thereby mitigating the stress that is applied to the folding region.

Further, when the display panel 100 is mounted on the housing member 400, the lower plate 200 is provided under the display panel 100, and the magnetic body group 300 is provided under the lower plate so as to be adhered thereto by the force of magnetic attraction. Therefore, no adhesive member is needed between the housing member 400 and the display panel 100, the materials of which have a large difference in stiffness and physical properties, whereby it is possible to prevent peeling-off of the adhesive member and prevent the display panel 100 from being gradually separated from the housing member 400 due to repeated folding and unfolding operations.

The second magnetic bodies 300b, which are provided in the folding region FR of the magnetic body group 300, are arranged in accordance with the segments 410, which are split in the folding region FR of the housing member 400. By providing the second magnetic bodies 300b and the segments 410, which are respectively adhered to the second magnetic bodies 300b and have a housing function, in the folding region FR, which is folded with a large curvature, it is possible to assure the flexibility of the flexible display device.

The surface of the magnetic body group 300 and the surface of the lower plate 200, which face each other, are maintained flat, and are therefore kept in surface contact with each other only by the force of magnetic attraction, without an additional protruding portion or fastening portion. Upon the folding operation, the second magnetic body 300b is not completely separated from the lower plate 200 in the folding region FR, but is kept in line contact with or in partial surface contact with the lower plate 200 by the force of magnetic attraction. Upon returning to the unfolded state from the folded state, the entire surface area of the second magnetic body 300b is brought into contact with the lower plate 200 by the force of magnetic attraction. Therefore, in spite of repeated folding and unfolding operations, the magnetic body group is not completely separated from the lower plate, and the components are therefore stably accommodated in the housing member.

As described above, upon the folding and unfolding operations, the display panel 100 and the lower plate 200 are operated together, and the lower plate 200 and the magnetic body group 300 are adhered to each other by the force of magnetic attraction. Therefore, no adhesive member is needed between portions that are separated from each other when the folding operation is repeated. Particularly, since no adhesive member is needed between the display panel 100 and the housing member 400, which have different material properties, it is possible to prevent damage to the display panel 100 attributable to peeling-off of the adhesive member in a rework process and consequently to improve production yield of the device.

Hereinafter, a detailed description of the components of the flexible display device will be made.

Figure 6:
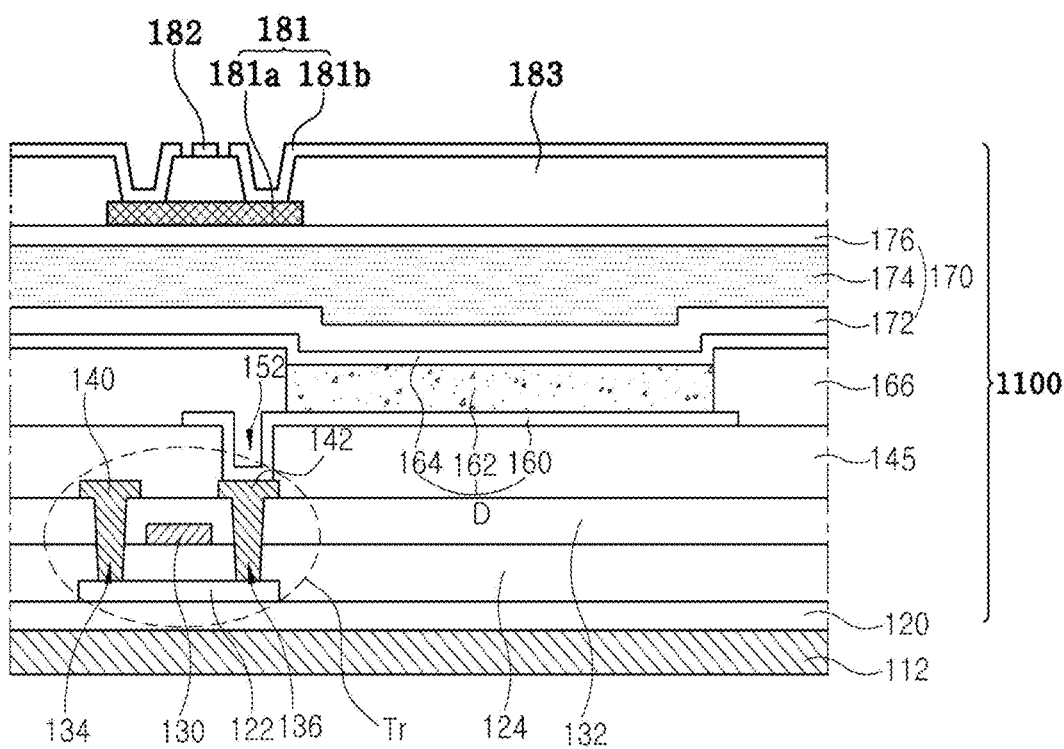
FIG. 6 is a cross-sectional view of a display panel of the flexible display device.

FIG. 6 is a cross-sectional view of the display panel 100 of the flexible display device.

As shown in FIG. 6, a buffer layer 120 is formed on the flexible substrate (the flexible base substrate 112), and a thin-film transistor Tr is formed on the buffer layer 120. The buffer layer 120 may be omitted.

A semiconductor layer 122 is formed on the buffer layer 120. The semiconductor layer 122 may be formed of an oxide semiconductor material or polycrystalline silicon.

In the case in which the semiconductor layer 122 is formed of an oxide semiconductor material, a light-shielding pattern (not shown) may be formed under the semiconductor layer 122. The light-shielding pattern serves to prevent light from being incident on the semiconductor layer 122 and consequently prevent the semiconductor layer 122 from being deteriorated by light. Alternatively, the semiconductor layer 122 may be formed of polycrystalline silicon. In this case, impurities may be doped into both edges of the semiconductor layer 122.

A gate insulation film 124, which is formed of an insulation material, is formed on the semiconductor layer 122. The gate insulation film 124 may be formed of an inorganic insulation material, such as silicon oxide or silicon nitride.

A gate electrode 130, which is formed of a conductive material such as metal, is formed on the gate insulation film 124 so as to be located corresponding to the center of the semiconductor layer 122.

Although it is illustrated in FIG. 6 that the gate insulation film 124 is formed on the entire area of the flexible base substrate 112, the gate insulation film 124 may be patterned in the same shape as the gate electrode 130.

An interlayer insulation film 132, which is formed of an insulation material, is formed on the gate electrode 130. The interlayer insulation film 132 may be formed of an inorganic insulation material such as silicon oxide or silicon nitride, or may be formed of an organic insulation material such as benzocyclobutene or photo-acryl.

The interlayer insulation film 132 includes first and second contact holes 134 and 136, through which both sides of the semiconductor layer 122 are exposed. The first and second contact holes 134 and 136 are located so as to be spaced apart from both sides of the gate electrode 130.

The first and second contact holes 134 and 136 are also formed in the gate insulation film 124. Alternatively, in the case in which the gate insulation film 124 is patterned in the same shape as the gate electrode 130, the first and second contact holes 134 and 136 may be formed only in the interlayer insulation film 132.

A source electrode 140 and a drain electrode 142, which are formed of a conductive material such as metal, are formed on the interlayer insulation film 132.

The source electrode 140 and the drain electrode 142 are located so as to be spaced apart from each other on the basis of the gate electrode 130. The source electrode 140 and the drain electrode 142 are in contact with both sides of the semiconductor layer 122 through the first and second contact holes 134 and 136, respectively.

The semiconductor layer 122, the gate electrode 130, the source electrode 140 and the drain electrode 142 constitute the thin-film transistor Tr, and the thin-film transistor Tr serves as a driving element.

The thin-film transistor Tr may have a coplanar structure in which the gate electrode 130, the source electrode 140 and the drain electrode 142 are located on the semiconductor layer 120.

Alternatively, the thin-film transistor Tr may have an inverted staggered structure in which the gate electrode is located under the semiconductor layer and the source electrode and the drain electrode are located on the semiconductor layer. In this case, the semiconductor layer may be formed of amorphous silicon.

Although not illustrated, gate wiring and data wiring intersect each other to define a pixel region. There is further provided a switching element, which is connected to the gate wiring and the data wiring. The switching element is connected to the thin-film transistor Tr, which is a driving element.

Power wiring is formed parallel to the gate wiring or the data wiring so as to be spaced apart therefrom. There may be further provided a storage capacitor for maintaining a constant voltage of the gate electrode of the thin-film transistor Tr, which is a driving element, during a frame.

A protective layer 145, which includes a drain contact hole 152, through which the drain electrode 142 of the thin-film transistor Tr is exposed, is formed so as to cover the thin-film transistor Tr. The thin-film transistor Tr is provided in each pixel region, and the thin-film transistors provided on the flexible base substrate 112 are collectively referred to as a thin-film transistor array.

A first electrode 160, which is connected to the drain electrode 142 of the thin-film transistor Tr through the drain contact hole 152, is formed on the protective layer 145 so as to be located within a corresponding pixel region. The first electrode 160 may be an anode, which may be formed of a conductive material having a relatively high work function. For example, the first electrode 160 may be formed of a transparent conductive material such as indium-tin-oxide (ITO) or indium-zinc-oxide (IZO), or may configured as a multi-layered electrode, which includes at least one layer formed of the above transparent conductive material.

In the case in which the display panel 100 is of a top-emission type, a reflective electrode or a reflective layer may be further formed under the first electrode 160. For example, the reflective electrode or the reflective layer may be formed of aluminum-palladium-copper (APC) alloy. In some cases, a transparent conductive material may be further included in the lower side of the reflective electrode.

A bank layer 166, which covers the edges of the first electrode 160, is formed on the protective layer 145. The bank layer 166 exposes the center of the first electrode 160 on the basis of each pixel region.

An organic emission layer 162 is formed on the first electrode 160. The organic emission layer 162 may have a single layer structure including an emitting material layer, which is formed of an emitting material. Alternatively, in order to enhance emission efficiency, the organic emission layer 162 may have a multilayer structure in which a hole injection layer, a hole transporting layer, an emitting material layer, an electron transporting layer and an electron injection layer are sequentially stacked on the first electrode 160.

A second electrode 164 is formed on the flexible base substrate 112, on which the above organic emission layer 162 has been formed. The second electrode 164 is located on the entire surface of the display area. The second electrode 164 may be a cathode, which may be formed of a conductive material having a relatively low work function. For example, the second electrode 164 may be formed of any one of aluminum (Al), magnesium (Mg), and aluminum-magnesium (AlMg) alloy.

The first electrode 160, the organic emission layer 162 and the second electrode 164 constitute an organic light-emitting diode D. The organic light-emitting diode D is connected to the thin-film transistor Tr in each pixel region. The organic light-emitting diodes formed in all pixel regions are collectively referred to as an organic light-emitting diode array.

An encapsulation film 170 is formed on the second electrode 164 in order to prevent external moisture from permeating the organic light-emitting diode D. The encapsulation film 170 may have a structure in which a first inorganic insulation layer 172, an organic insulation layer 174 and a second inorganic insulation layer 176 are stacked on one another. However, the present disclosure is not limited thereto. Alternatively, the encapsulation film 170 may have a structure in which inorganic insulation layers and organic insulation layers are stacked alternately and in which the inorganic insulation layer is located at the outermost position.

A touch electrode array, which includes a first touch electrode 181 and a second touch electrode 182 intersecting each other to detect a touch, may be further provided on the encapsulation film 170. Bridge wiring 181a is provided on the second inorganic insulation layer 176, which is located at the outermost position, a touch insulation film 183 is provided on the bridge wiring 181a, and a first touch pattern 181b and the second touch electrode 182 are provided on the touch insulation film 183 so as to be spaced apart from each other. The first touch pattern 181b is electrically connected to the bridge wiring 181a through a contact hole formed in the touch insulation film 183, thereby constituting the first touch electrode 181. Only a portion of the second touch electrode 182 is illustrated in the drawings. The second touch electrode 182 is located on a portion of the touch insulation film 183 on which the first touch pattern 181b is not disposed, and a mutual capacitance Cm is generated between the first touch pattern 181b and the second touch electrode 182, which are spaced apart from each other.

The presence or absence of a touch may be detected by sensing variation in mutual capacitance Cm in response to a touch.

The illustrated touch electrode array is merely illustrative, and the present disclosure is not limited thereto. As illustrated, the touch electrode array may be formed directly on the encapsulation film 170. Alternatively, an additional substrate or insulation film may be further provided between the encapsulation film and the touch electrode array, or the touch electrode array may be provided inside a cover film. In some cases, the touch electrode array may be omitted, or the encapsulation film 170 may be located at the upper side of the display panel 100.

A polarizing plate (not shown) for reducing reflection of external light may be attached onto the touch electrode array. For example, the polarizing plate may have a circular shape. A cover layer, such as a cover window or the like, may be further provided to protect the upper side of the touch electrode array.

Unexplained reference numeral 1100 denotes an array structure, which includes the thin-film transistor array formed on the flexible base substrate 112, the organic light-emitting diode array connected to the respective thin-film transistors Tr, the encapsulation film 170 covering the above components, and the touch electrode array 181, 182 and 183.

The above-described display panel is an exemplary organic light-emitting display panel. Any other type of display panel may be used, as long as it is flexible. For example, the above-described organic light-emitting display panel may be replaced by a flexible liquid crystal panel, a quantum dot display panel, or an electrophoretic display panel.

Figure 7:
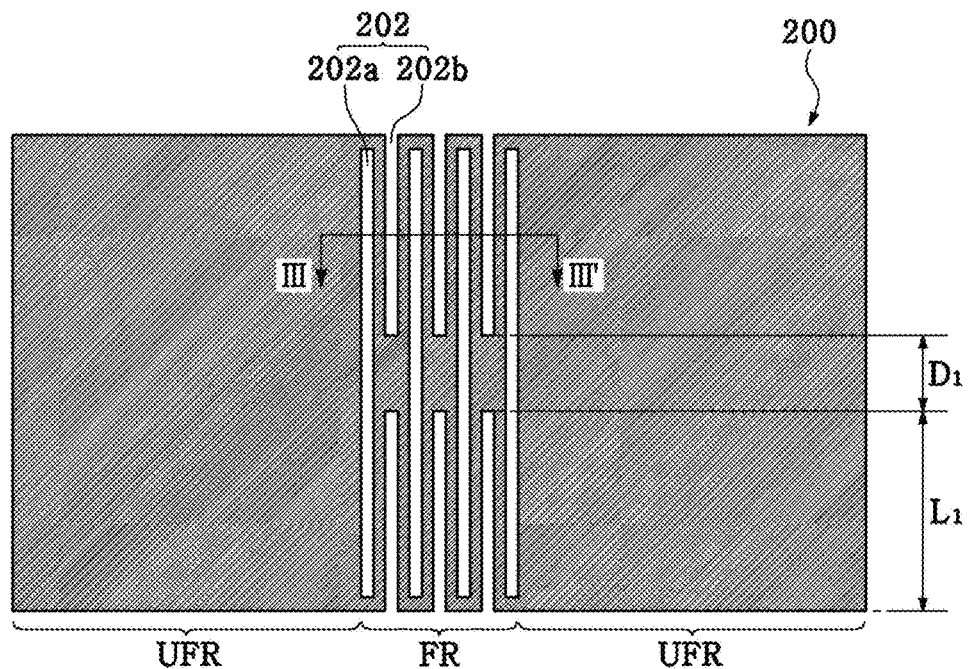
FIG. 7 is a plan view of a lower plate of the flexible display device.

FIG. 7 is a plan view of the lower plate of the flexible display device, and FIGS. 8A to 8D are cross-sectional views taken along line in FIG. 7.

The lower plate 200 of the flexible display device according to the first embodiment of the present disclosure is formed of a steel alloy material having certain stiffness, such as steel use stainless (SUS), which can be adhered to the magnetic body group 300 formed of a magnet steel material by the force of magnetic attraction and which comprises 50 percent or less of alloying elements other than steel and 7 to 32 percent of chrome (Cr). In addition to steel and chrome, the material of the lower plate 200 may further comprise metal such as nickel and a nonmetallic material such as silicon (Si).

Steel use stainless is generally classified into austenite series, ferrite series, and martensite series. Among them, an austenite series may be excluded in order to enhance force by which the lower plate 200 is adhered to the magnetic bodies.

As shown in FIG. 7, the lower plate 200 includes the slits 202 formed in the folding region FR. The slits 202 include a first pattern 202a, which is formed at a $(2n-1)^{th}$ row, and a pair of second patterns 202b, which is formed at a $(2n)^{th}$ row (here, n is a positive integer).

Although it is illustrated in FIG. 7 that the folding region FR is located at the center of the lower plate 200, the position of the folding region FR is not limited thereto. Alternatively, two or more folding regions may be defined.

Each of the first and second patterns 202a and 202b may have a rectangular shape. The distance between the pair of second patterns 202b, which are formed at the $(2n)^{th}$ row, may be determined depending on the dimension of the first pattern 202a, which is formed at the $(2n-1)^{th}$ row.

Both ends of the first pattern 202a may be located inwards from both sides of the lower plate 200 in the folding region FR, and one end of each of the second patterns 202b may be located at a respective one of both sides of the lower plate 200 in the folding region FR.

That is, each of both sides of the lower plate 200 has a discontinuity formed at the $(2n)^{th}$ row. Therefore, the folding region FR of the lower plate 200 is defined by the region between the first pattern 202a and the second patterns 202b and the region between the pair of second patterns 202b, whereby the folding region FR exhibits the function of a spring.

It is illustrated in FIG. 7 that a single first pattern 202a is formed at the odd-numbered $((2n-1)^{th})$ row and a pair of second patterns 202b is formed at the even-numbered $((2n)^{th})$ row. However, two or more first patterns 202a may be formed, and three or more second patterns 202b may be formed.

Each of the first and second patterns 202a and 202b extends in the row direction. That is, the long axis of each of the first and second patterns 202a and 202b may be parallel to the row direction.

A first distance D1 between the pair of second patterns 202b may be equal to or less than a first length L1 of each of the second patterns 202b. It is desirable for the first distance D1 to be less than the first length L1.

When the flexible display device is folded and unfolded, the folding region FR, in which the slits 202 are formed, functions as a spring and increases the elastic restoring energy of the lower plate 200. Therefore, when the stress applied to the flexible display device upon the folding operation is removed, the time taken to be restored to the original state can be shortened.

The shape of the slits 202 is not limited to the rectangular shape shown in FIG. 7. The first and second patterns, which constitute the slits 202, may have any other polygonal shape, a polygonal shape having rounded corners, or an elliptical shape, which extends long in the folding-axis direction.

As shown in FIG. 7, the slits 202 may be formed such that the first patterns 202a and the second patterns 202b are alternately arranged at regular intervals in the entire area of the folding region FR. Alternatively, a group of patterns having an identical shape may be arranged more densely or more sparsely from the center of the folding region FR to the edge of the folding region FR. Alternatively, a group of patterns may be arranged randomly so as to just distinguish the folding region FR from the non-folding region UFR. Each of the first and second patterns 202a and 202b may be formed such that the longitudinal direction thereof is parallel to the folding-axis direction. That is, the slits 202 may be formed so as to extend long in the folding-axis direction when viewed in plan.

As shown in FIG. 7, due to the slits 202 formed in the folding region FR of the lower plate 200, it is possible to prevent a crack in the folding region FR attributable to repeated folding and unfolding operations and reduce the amount of stress that is applied to the folding region FR upon the folding operation.

The lower plate 200 is located under the display panel 100 to support the same. The lower plate 200 has higher stiffness than the flexible base substrate 112. That is, the lower plate 200 may have a greater Young's modulus than the flexible base substrate 112.

Since the lower plate 200 is formed of a material having relatively high stiffness such as, for example, steel use stainless (SUS), it may have high restoring force and may be reduced in thickness.

That is, in the case in which the lower plate 200 is formed of a material having relatively high stiffness, such as SUS, the stiffness of the lower plate 200 may be maintained at a desired level in spite of a reduction in thickness, thereby stably supporting the display panel 100. Further, it is possible to reduce plastic deformation of the lower plate 200 attributable to a reduction in thickness.

However, the elastic deformation region of the lower plate 200, which is formed of a material having relatively high stiffness and has a relatively small thickness, is narrow. Thus, it is very difficult for such a lower plate to be restored to its original state after deformation. That is, the lower plate 200 is maintained in a folded state for a long time without being unfolded after the folding operation is completed.

In the flexible display device according to the present disclosure, due to one or more slits 202 formed in the folding region FR of the lower plate 200, the elastic deformation region of the lower plate 200 increases. Further, due to the slits 202, the folding region FR of the lower plate 200 exhibits the function of a spring, and the restoring force of the lower plate 200 is enhanced. Therefore, it is possible to solve a problem in which the time taken for the lower plate 200 to be restored increases due to the reduction in thickness. The slits 202 formed in the folding region FR of the lower plate 200 may be formed to a depth that is equal to the thickness of the lower plate, or may be formed to a depth that is less than the thickness of the non-folding region UFR of the lower plate 200. Alternatively, the slits 202 may be formed such that the first patterns are formed throughout the thickness of the lower plate 200 and such that the second patterns are formed to a depth less than the thickness of the lower plate 200.

As described above, since the lower plate 200 is formed of a material having high stiffness, the restoring force thereof is enhanced, and the elastic deformation region thereof increases due to the slits 202. Therefore, in spite of a reduction in thickness of the lower plate 200, e.g., to 2 mm or less, the flexible display device has improved reliability with respect to the folding operation and can be easily restored to its original state.

As shown in FIGS. 8A to 8D, a first step-compensating layer 211 and a second step-compensating layer 213 may be respectively formed on the top surface and the bottom surface of the lower plate 200 in order to prevent the formation of steps between the slits 202 and protect the lower plate 200. Each of the first and second step-compensation layers 211 and 213 may be configured as a metal film, which is formed of steel use stainless (SUS), which is the main ingredient of a body 200a of the lower plate 200. In this case, the second step-compensation layer 213, which is disposed on the bottom surface of the lower plate 200, may be in direct contact with the magnetic body group 300.

Alternatively, the first and second step-compensation layers 211 and 213 may be formed of a material having lower stiffness than the material of the lower plate 200. For example, each or any one of the first and second step-compensation layers 211 and 213 may be formed of any one selected from among polyurethane (PU), thermoplastic polyurethane (TPU), polyacrylate, rubber, and silicon (Si).

In this case, the first and second step-compensation layers 211 and 213 serve to protect the slits 202 by covering the same and to eliminate steps. Further, the first and second step-compensation layers 211 and 213 may prevent the occurrence of defective display, which may be caused by the slits 202.

Only one of the first and second step-compensation layers 211 and 213 may be formed, and may be selectively provided only on the folding region FR.

In some cases, the first and second step-compensation layers 211 and 213 may also be disposed in the slits 202 formed in the folding region FR. In this case, the step-compensation layers disposed in the slits 202 are formed of a material that has lower stiffness than the material of the lower plate 200, i.e., SUS, and the reliability of the step-compensation layers may therefore be maintained in spite of repeated folding and unfolding operations of the folding region FR.

Figure 8A:
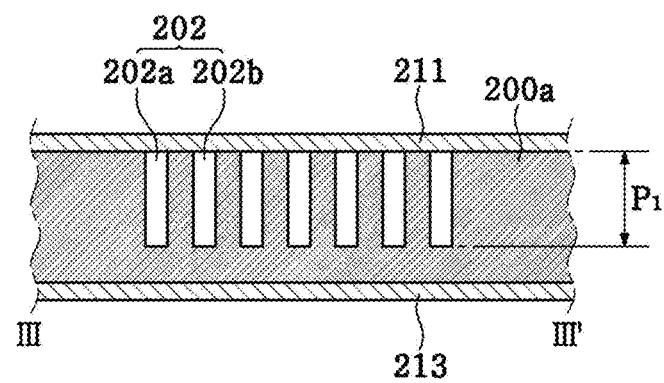
FIGS. 8A to 8D are cross-sectional views taken along line in FIG. 7.
Figure 8B:
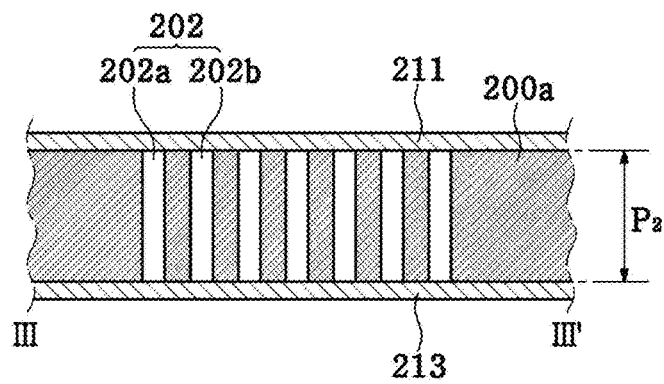
Figure 8C:
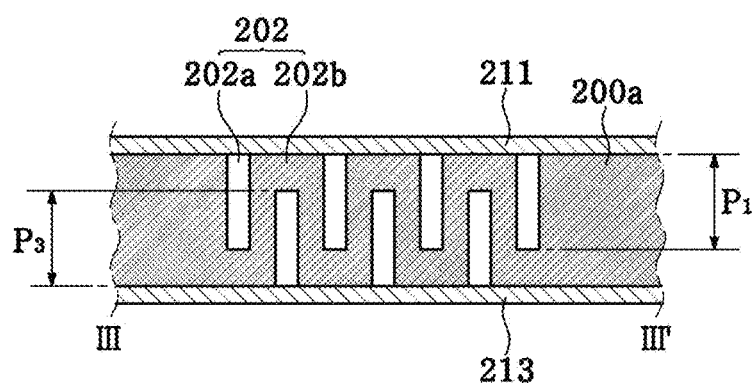
Figure 8D:
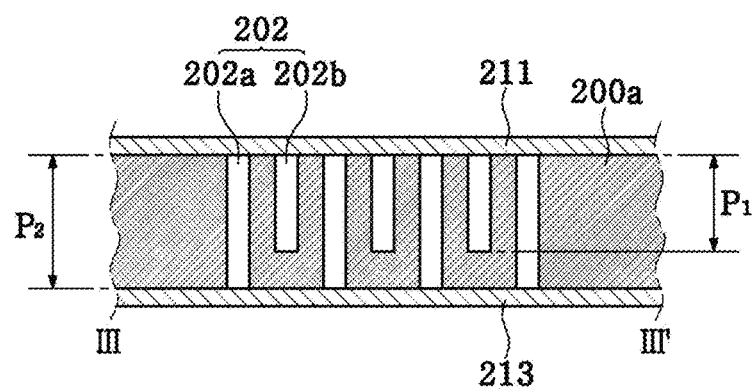

As shown in FIG. 8A, the slits 202 may be formed to a depth equivalent to a partial thickness P1 of the body 200a. As shown in FIG. 8B, the slits 202 may be formed throughout the entire thickness P2 of the body 200a. As shown in FIG. 8C, slits 202, which extend from the top surface of the body 200a to a depth equivalent to the partial thickness P1 of the body 200a, and slits 202, which extend from the bottom surface of the body 200a to a depth equivalent to a partial thickness P3 of the body 200a, may be arranged alternately. As shown in FIG. 8D, slits 202, which are formed throughout the entire thickness P2 of the body 200a, and slits 202, which extend from the top surface of the body 200a to a depth equivalent to the partial thickness P1 of the body 200a, may be arranged alternately.

As described above, according to the flexible display device of the present disclosure, the entire thickness thereof can be reduced due to the lower plate 200 having high stiffness. In addition, the restoring force of the lower plate 200 can be enhanced due to the slits 202, which enables the folding region FR of the lower plate 200 to exhibit the function of a spring. That is, there can be provided a lower plate having a small thickness and high restoring force.

Figure 9A:
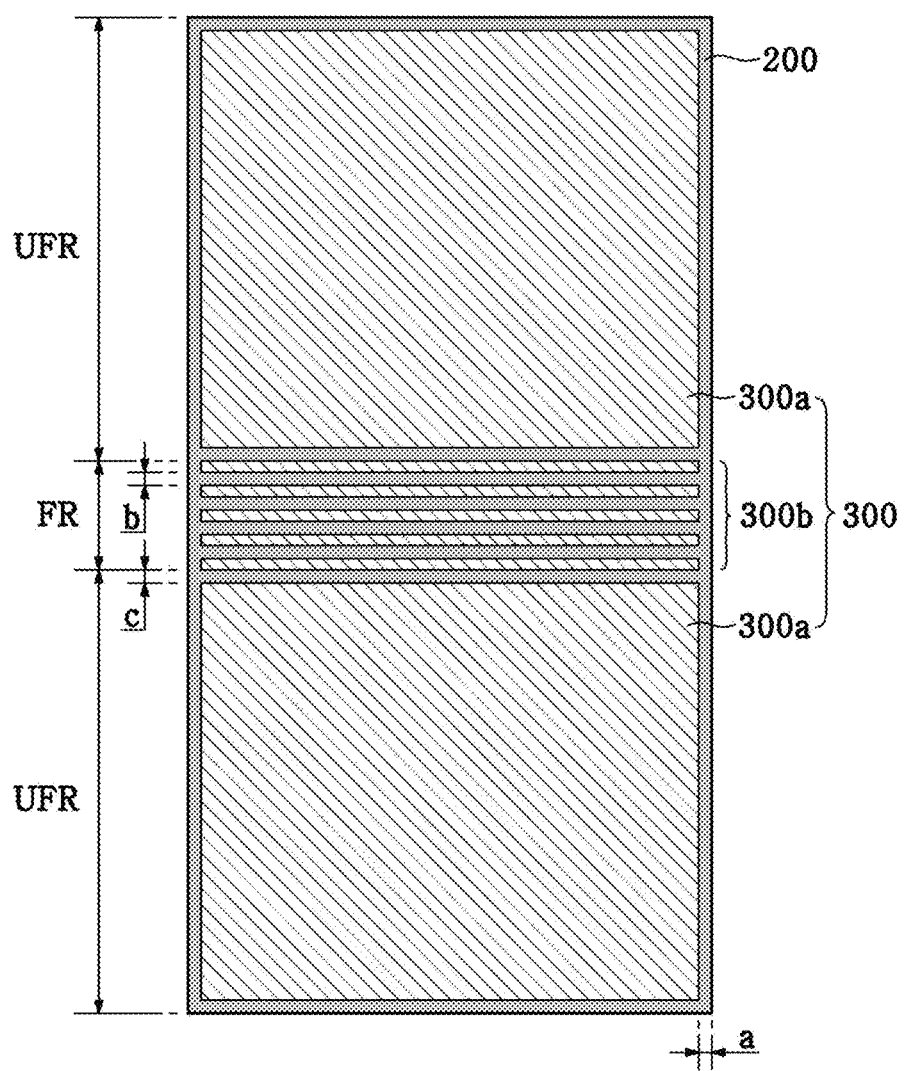
Figure 9B:
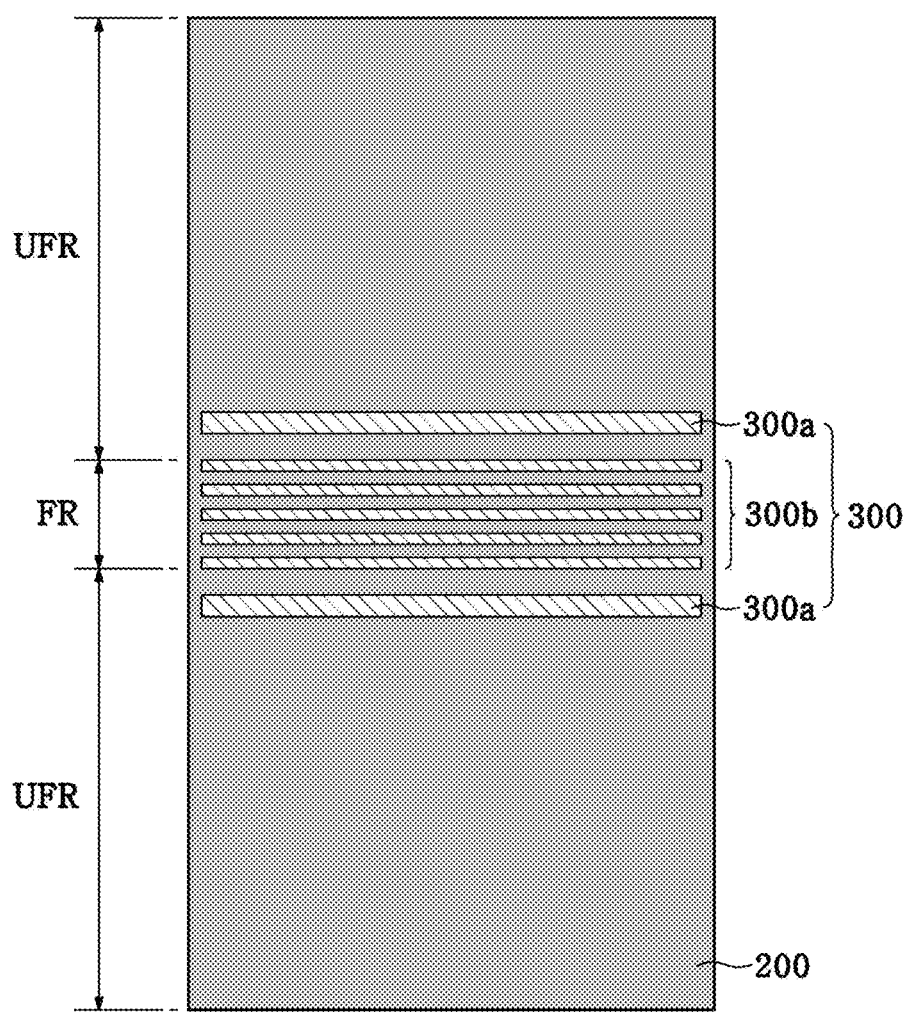

FIGS. 9A to 9C are plan views illustrating various embodiments of the magnetic bodies, which are brought into contact with the lower plate, in the flexible display device according to the present disclosure. FIGS. 9A to 9C illustrate the surfaces of the lower plate 200 and the magnetic body group 300 when viewed from the bottom. Since the lower plate 200 has an area greater than the area of the magnetic body group 300, the edge portions of the lower plate 200 can be seen when viewed from the bottom. An adhesive member (not shown) may be provided on the bottom surface of the magnetic body group 300, and thus the housing member 400, which is disposed under the magnetic body group 300 on the basis of FIG. 1, may be bonded to the magnetic body group 300.

In the flexible display device according to the present disclosure, the magnetic body group 300 is formed of magnet steel, which is an alloy comprising at least two metals selected from the group consisting of carbon, chrome, tungsten, molybdenum, cobalt, aluminum, steel, vanadium (V), manganese, titanium (Ti) and combinations thereof. This material has a residual flux density (Br) of 5,000 gauss or more, and thus the magnetic body group 300 functions as a type of permanent magnet. Further, in the flexible display device according to the present disclosure, the magnetic body group 300 includes the first magnetic body 300a, which is formed in a plate configuration in the non-folding region UFR, and the second magnetic body 300b, which is split into a plurality of pieces in the folding region FR so as to correspond to the split configuration of the housing member 400. Each second magnetic body 300b has a small width and extends in the folding-axis direction.

The second bodies 300b illustrated in FIGS. 9A to 9C have the same configuration as each other in the folding region FR, but the first bodies 300a illustrated in FIGS. 9A to 9C have different arrangements and configurations from each other in the non-folding region UFR.

Referring to FIG. 9A, first magnetic bodies 300a are provided in the non-folding regions UFR, which are located above and below the folding region FR. Each of the first magnetic bodies 300a is formed in the shape of a large plate having an area corresponding to a respective one of the non-folding regions. A plurality of second magnetic bodies 300b is provided in the folding region FR so as to correspond to the segments split in the housing member 400.

The first magnetic body 300a provided in the non-folding region UFR is kept in surface contact with the lower plate 200 by the force of magnetic attraction regardless of whether a folding or unfolding operation of the flexible display device is being performed. Since the second magnetic body 300b provided in the folding region FR is formed of magnet steel, which has higher stiffness than the material of the folding region FR of the lower plate 200, the second magnetic body 300b is kept in surface contact with the lower plate 200 in the unfolded state, but is kept in partial contact with the lower plate 200, which is bent with a large curvature in the folded state. In the folded state, the second magnetic body 300b is kept in at least line contact with the folding region FR of the lower plate 200 in the folding-axis direction without being completely separated from the lower plate 200. Therefore, upon returning to the unfolded state from the folded state, the entire surface area of the second magnetic body 300b is rapidly brought into contact with the lower plate 200 without any gap therebetween.

Referring to FIG. 9A, the first magnetic body 300a is spaced apart from the edge of the lower plate 200 by a first distance a. As described above, this serves to make the magnetic body group 300 invisible in any direction from the display surface of the display panel 100 (refer to FIG. 1). In the same manner, the second magnetic body 300b is also spaced apart from the edge of the lower plate 200 by the first distance a. The second magnetic bodies 300b provided in the folding region FR are spaced apart from each other by a second distance b. However, this is merely illustrative, and the arrangement of the second magnetic bodies 300b may vary in accordance with the configuration of the folding region FR of the housing member 400. Depending on the degree to which the folding region FR is bent, the distance between the second magnetic bodies 300b may increase, or the width of each of the second magnetic bodies 300b may decrease.

One of the second magnetic bodies 300b, which is located at the outermost position in the folding region FR, may be spaced apart from the first magnetic body 300a provided in the non-folding region UFR by a third distance c. The value of the third distance c and the width of the first magnetic body 300a may vary, as shown in FIGS. 9B and 9C.

The reason for providing the first and second magnetic bodies 300a and 300b in the non-folding region UFR and the folding region FR of the magnetic body group 300 is to allow at least a portion of the magnetic body group 300 to be kept in contact with the lower plate 200 without being separated from the lower plate 200 in spite of repeated folding and unfolding operations. In addition, in the case in which an adhesive member is provided on the bottom surface of the magnetic body group 300 and the housing member 400 is bonded to the magnetic body group 300 by the adhesive member, the magnetic body group 300 and the housing member 400 are operated together upon the folding operation. Therefore, upon the folding operation, at least a portion of the magnetic body group 300 is kept in contact with the lower plate 200 rather than being completely separated from the lower plate 200, whereby no adhesive member is needed between the lower plate 200 and the magnetic body group 300.

As shown in FIGS. 9B and 9C, the area occupied by the first magnetic body 300a in the non-folding region UFR of the magnetic body group 300 may be more than 10% of the entire area of the non-folding region UFR of the lower plate 200. The reason for this is to assure that the force of magnetic attraction between the first magnetic body 300a and the non-folding region UFR of the lower plate 200 is equal to or greater than the force of magnetic attraction between the second magnetic body 300b and the folding region FR of the lower plate 200 in the unfolded state. As shown in FIG. 9A, in the case in which the first magnetic body 300a is provided in the entire area of the non-folding region UFR, no step is present between the non-folding region UFR and the folding region FR. As shown in FIGS. 9B and 9C, even when the first magnetic body 300a is selectively provided only on a portion of the non-folding region UFR, the force of magnetic attraction by which the magnetic body group 300 is kept in surface contact with the bottom surface of the lower plate 200 can be sufficiently assured.

Figure 10A:
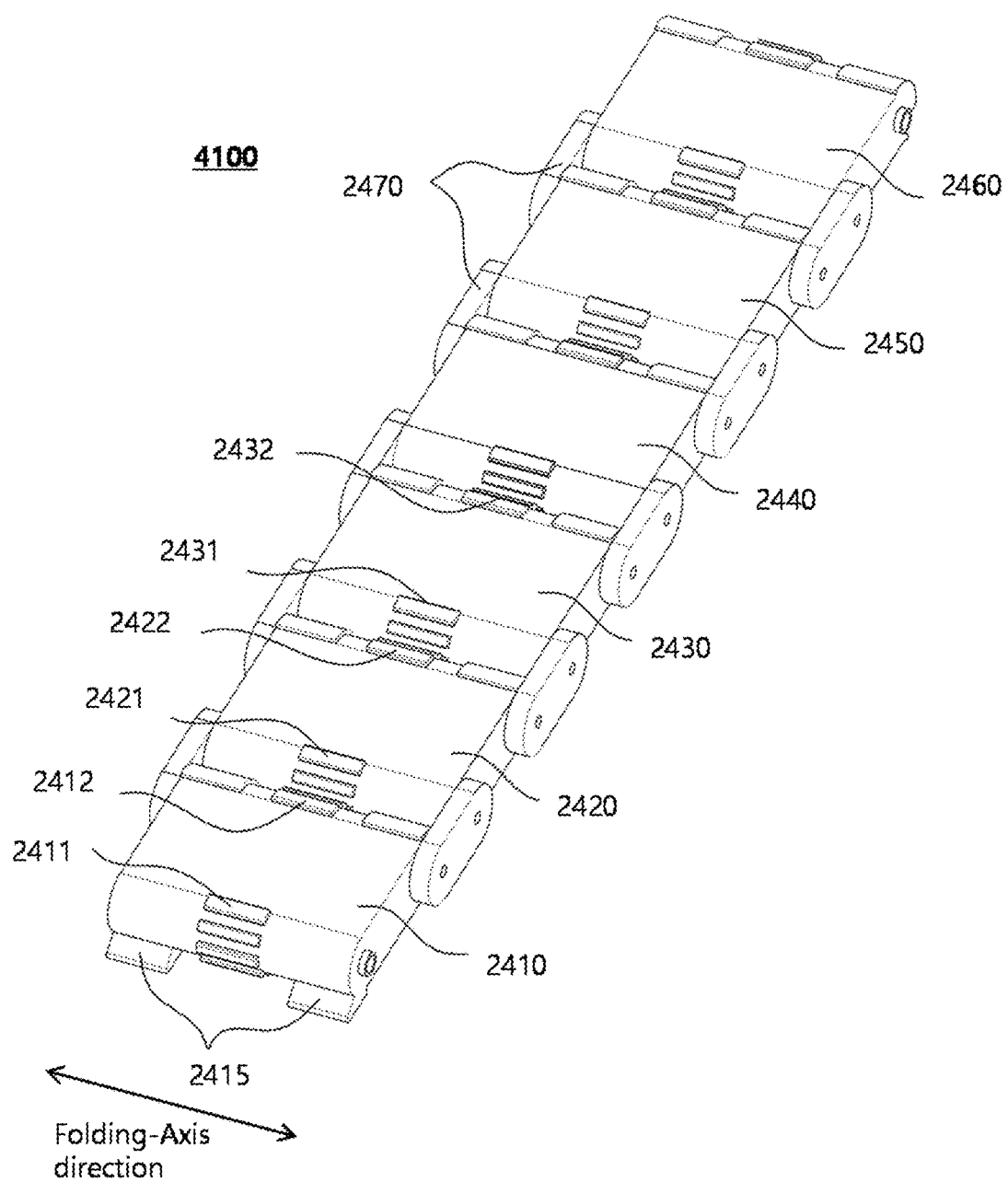
FIGS. 10A and 10B are perspective views respectively illustrating the unfolded state and the folded state of another exemplary folding region of a housing member in the flexible display device according to the present disclosure.
Figure 10B:
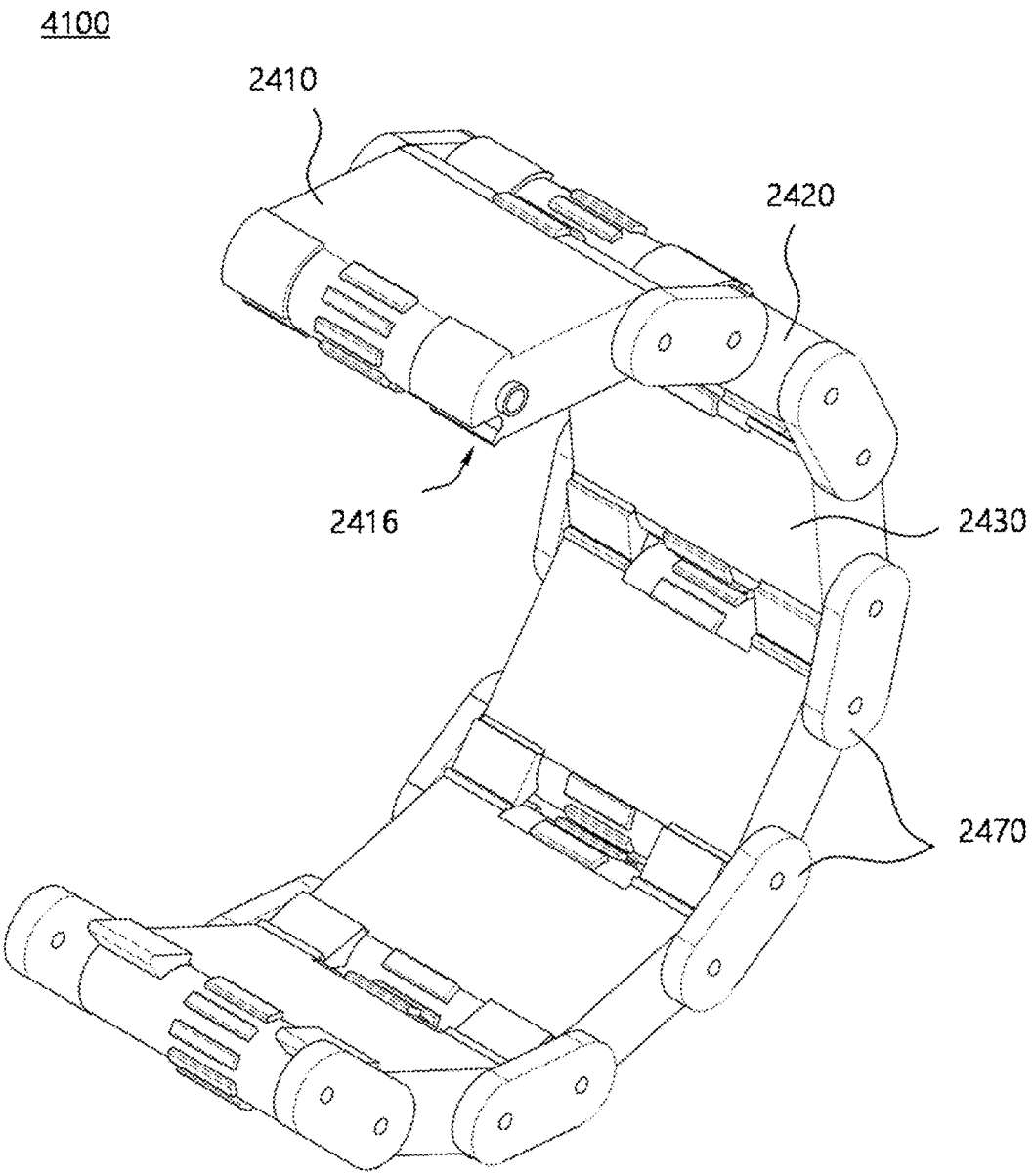

FIGS. 10A and 10B are perspective views respectively illustrating the unfolded state and the folded state of the folding region of the housing member in the flexible display device according to the present disclosure.

In the flexible display device according to another embodiment of the present disclosure, the folding region FR of the housing member 400 may include hinges and gears, rather than the springs provided in the embodiment described above with reference to FIGS. 1 to 4.

Referring to FIGS. 10A and 10B, the folding region 4100 of the flexible display device includes a first unit hinge 2410, a second unit hinge 2420, which has the same configuration as the first unit hinge 2410 and meshes with one side of the first unit hinge 2410 so as to rotate relative to the same, a third unit hinge 2430, which meshes with one side of the second unit hinge 2420 so as to rotate relative to the same and is disposed opposite the first unit hinge 2410 on the basis of the second unit hinge 2420, and connection members 2470, which interconnect the unit hinges 2410 to 2460 arranged adjacent to each other.

In addition, there are provided fourth to sixth unit hinges 2440 to 2460, which mesh with each other in the same manner as the first to third unit hinges 2410 to 2430.

As shown in FIG. 10B, the folding region 4100 may be folded (bent) about the folding axis. In the folded state, the folding region 4100 is folded in an approximately C-shaped configuration such that the top surfaces of the first to sixth unit hinges 2410 to 2460 are oriented in the inward direction and the bottom surfaces thereof are oriented in the outward direction.

The folding region 4100 of the housing member is configured as an assembly formed by engagement of the first to sixth unit hinges 2410 to 2460. That is, the first to sixth unit hinges 2410 to 2460 are arranged in series along the side of the folding region of the housing member 400 (refer to FIG. 1) and extend in the folding-axis direction. Each of the second magnetic bodies 300b may be in contact with the top surface of a respective one of the first to sixth unit hinges 2410 to 2460 in the folding-axis direction.

The first unit hinge 2410 has a long elliptical shape when viewed from the side. The first unit hinge 2410 includes a first rotary shaft and a second rotary shaft, which are respectively disposed at two opposite side portions of the first unit hinge 2410. The first unit hinge 2410 further includes first gear teeth 2411 formed on the outer circumferential surface adjacent to the first rotary shaft and second gear teeth 2412 formed on the outer circumferential surface adjacent to the second rotary shaft.

Each of the first gear teeth 2411 and the second gear teeth 2412 may be formed on the entire area or on a portion of the corresponding outer circumferential surface. First gear teeth 2421 of the second unit hinge 2420 mesh with the second gear teeth 2412 of the first unit hinge 2410, and first gear teeth 2431 of the third unit hinge 2430 mesh with second gear teeth 2422 of the second unit hinge 2420. In this manner, the first gear teeth 2411, 2421 and 2431 and the second gear teeth 2412, 2422 and 2432 of the unit hinges mesh each other.

The first to sixth unit hinges 2410 to 2460 have the same configuration.

The first to sixth unit hinges 2410 to 2460 will be described on the assumption that the first rotary shaft and the second rotary shaft are disposed inside one side and the opposite side of each of the unit hinges 2410 to 2460.

The first unit hinge 2410 and the second unit hinge 2420 are connected to each other in a manner such that the second rotary shaft of the first unit hinge 2410 and the first rotary shaft of the second unit hinge 2420 are connected to each other by the connection member 2470. The second rotary shaft of the second unit hinge 2420 and the first rotary shaft of the third unit hinge 2430 are connected to each other by the connection member 2470. In this manner, the unit hinges 2410 to 2460, which are arranged in series, are connected to each other by the connection members 2470 so as to rotate relative to each other, and are sequentially rotated upon the folding and unfolding operations.

Since the first rotary shaft is fixed to the one side of the first unit hinge 2410, the second unit hinge 2420 and subsequent unit hinges 2430 to 2460 are arranged so as to perform relative rotation about the second rotary shaft of the first unit hinge 2410.

When the rotation of the second unit hinge 2420 relative to the first unit hinge 2410 is completed, the third unit hinge 2430 performs relative rotation about the second rotary shaft of the second unit hinge 2420. In this manner, all of the unit hinges, which are connected to each other, perform relative rotation at regular angles.

After the relative rotation of the second to sixth unit hinges 2420 and 2460 is sequentially performed, as shown in FIG. 10B, the folding region 4100 is folded in an approximately C-shaped configuration.

The first gear teeth 2421 of the second unit hinge 2420 mesh with the second gear teeth 2412 of the first unit hinge 2410, and only the second unit hinge 2420 performs relative rotation. The rotation of the second unit hinge 2420 relative to the first unit hinge 2410 does not interrupt the rotation of the other unit hinges. That is, each of the unit hinges can perform relative rotation independently. Since the unit hinges rotate about two or more multiple shafts, the unit hinges can perform relative rotation in sequence or in stages. If the gears are configured to rotate about a single shaft, when one of the gears rotates, all of the other gears simultaneously rotate together, whereby the unit hinges cannot rotate in sequence or in stages.

The first unit hinge 2410 includes a rotation-restricting member 2415, which protrudes from one side of the bottom surface thereof, and a restricting recess 2416, which is formed in the opposite side of the bottom surface thereof and into which a rotation-restricting member of the second unit hinge 2420 is inserted. When the folding region 4100 of the housing member is folded, the rotation-restricting member 2415 of each of the unit hinges is inserted into the restricting recess 2416 formed in the unit hinge that is located adjacent thereto, whereby rotation of the unit hinges is restricted. Through this insertion of the rotation-restricting member 2415 into the restricting recess 2416, the angle at which each of the unit hinges performs relative rotation is determined. For example, the angle at which each of the unit hinges performs relative rotation may be determined by the degree to which the rotation-restricting member 2415 protrudes or the degree to which the restricting recess 2416 is depressed. Due to the insertion of the rotation-restricting member 2415 into the restricting recess 2416, the folding region 4100 of the housing member can be folded with a constant curvature R, and the stiffness of the folding region can be assured.

The above-described folding region of the housing member is merely illustrative. The length of each of the unit hinges may be increased in the folding-axis direction, or the gears of the unit hinges may be changed in shape, or may be replaced by other rotating members.

Figure 11:
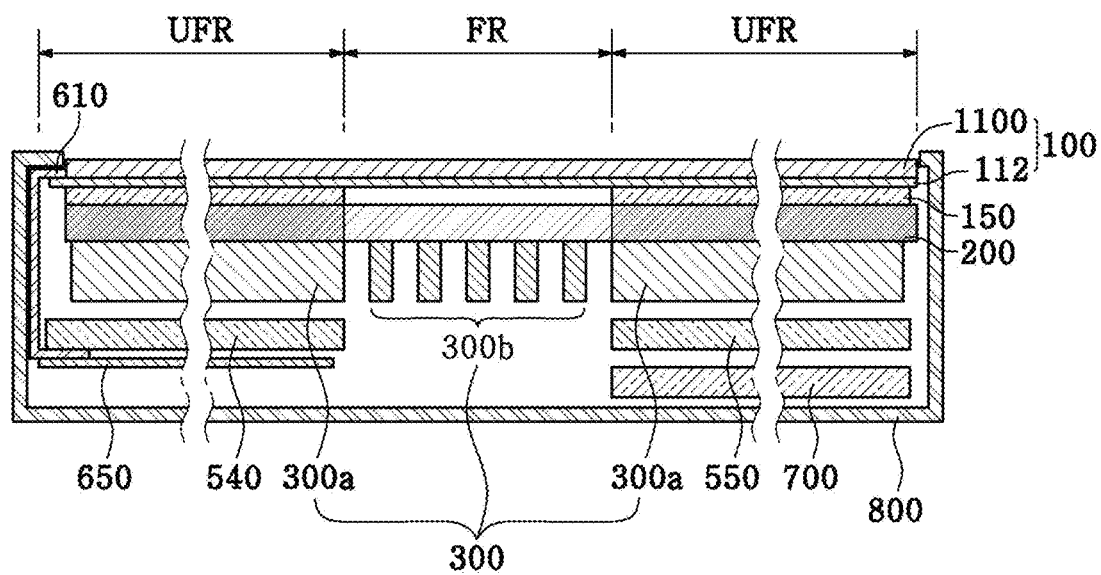
FIG. 11 is a cross-sectional view illustrating an exemplary electronic device to which the flexible display device according to the present disclosure is applied.

FIG. 11 is a cross-sectional view illustrating an exemplary electronic device to which the flexible display device according to the present disclosure is applied.

As shown in FIG. 11, an exemplary electronic device implemented by the flexible display device according to the present disclosure includes a display panel 100, which includes a flexible base substrate 112 and an array structure 1100 disposed on the flexible base substrate 112, the array structure 1100 including the aforementioned thin-film transistor array, organic light-emitting diode array, encapsulation film and touch electrode array, a flexible printed circuit board 610, which is connected to a pad portion (not shown) provided at one side of the flexible base substrate 112, boards 540 and 550, which are provided under the first magnetic bodies 300a in the non-folding region UFR, a printed circuit board 650, which is provided under the boards 540 and 550 so as to be connected with the flexible printed circuit board 610, a battery 700, which is connected with the printed circuit board 650 to supply electrical power to the same, and a case structure 800, which accommodates the components 150, 200 and 300, which are disposed under the display panel 100.

In order to shield the flexible printed circuit board 610, the case structure 800 may be formed such that the top panel extending from the side at which the flexible printed circuit board 610 is located is formed to be longer than the top panels extending from the other sides. Like the above-described housing member 400 shown in FIGS. 1 to 4, the folding region FR of the case structure 800 may be split into a plurality of segments, which are connected to each other by springs, so as to realize a kind of joint movement due to expansion and compression of the springs upon the folding and unfolding operations.

In some cases, as shown in FIG. 5, a driving circuit may be embedded in the top surface of the display panel 100 in an integrated circuit (IC) configuration. In this case, the driving circuit may be connected to the printed circuit board 650 via a connector (not shown).

The illustrated electronic device further includes a lower plate 200, which is configured as a single plate having no splits, and a magnetic body group 300, which includes a first magnetic body 300a provided in the non-folding region UFR and a second magnetic body 300b provided in the folding region FR. In order to enhance reliability in spite of repeated folding and unfolding operations, as described above, the lower plate 200 may include slits 202 (refer to FIG. 7). An adhesive layer 150 for bonding the display panel 100 and the lower plate 200 to each other may be provided only in the non-folding region UFR. This is for preventing the adhesive layer 150 from peeling off from the folding region FR due to repeated folding and unfolding operations. Since each of the first and second magnetic bodies 300a and 300b is provided in a corresponding one of the non-folding region UFR and the folding region FR of the magnetic body group 300, the contact area between the second magnetic body 300b, having certain stiffness, and the lower plate 200, which are adhered to each other by the force of magnetic attraction, can vary upon the folding and unfolding operations.

In some cases, one or more second magnetic bodies 300b may be provided in the folding region FR. Although not illustrated, the second magnetic bodies 300b may be bonded to protrusions protruding from the bottom of the case structure 800. In this case, the number of protrusions may be set to be equal to the number of second magnetic bodies 300b provided in the folding region FR.

The board 540 is provided to prevent interference between the display panel 100 and the printed circuit board 650, and the board 550 is provided to prevent interference between the display panel 100 and the battery 700. However, if the lower plate 200 and the magnetic body group 300 sufficiently exhibit a shielding function, the boards 540 and 550 may be omitted.

Hereinafter, a flexible display device according to a second embodiment will be described.

Figure 12:
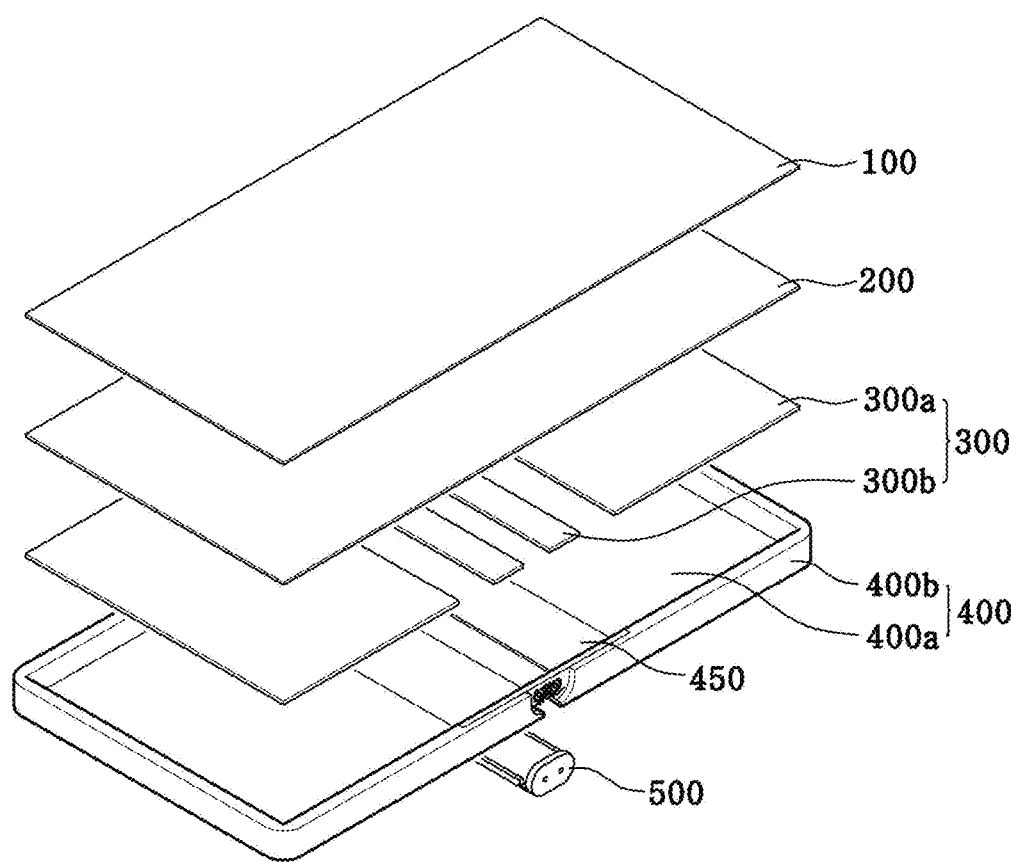
FIG. 12 is an exploded perspective view illustrating the unfolded state of a flexible display device according to a second embodiment.
Figure 13A:
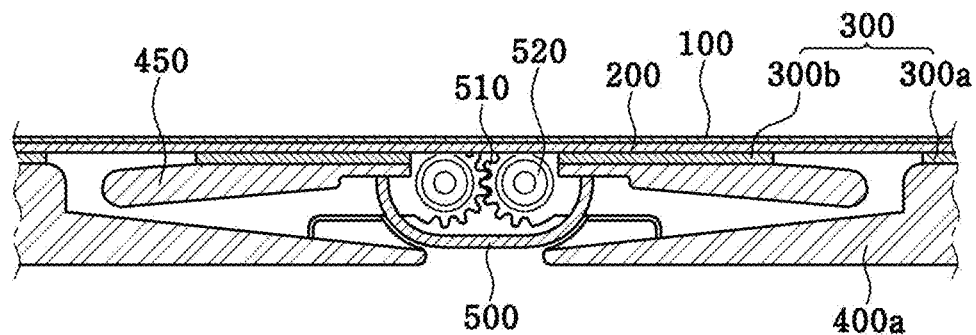
FIGS. 13A and 13B are cross-sectional views of a folding region and peripheral components in the unfolded state and in the folded state of the flexible display device shown in FIG. 12.
Figure 13B:
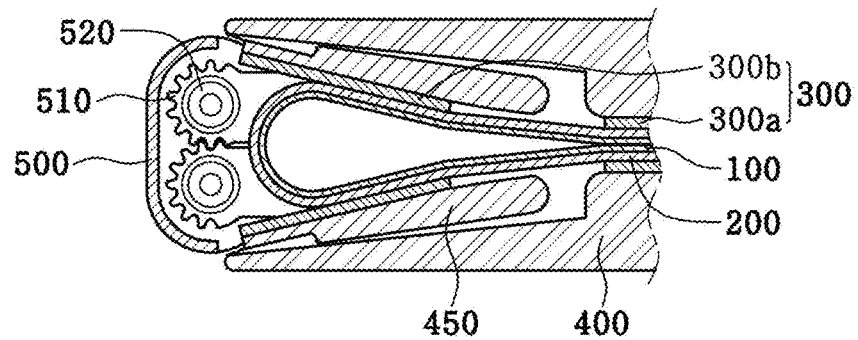

FIG. 12 is an exploded perspective view illustrating the unfolded state of the flexible display device according to the second embodiment. FIGS. 13A and 13B are cross-sectional views of a folding region and peripheral components in the unfolded state and in the folded state of the flexible display device shown in FIG. 12.

As shown in FIGS. 12 to 13B, the flexible display device according to the second embodiment differs from the flexible display device according to the first embodiment in that the housing member 400 is divided into two units in the folding region FR, each unit including a gear shaft 520, a support frame 450, and a gear 510 having gear teeth formed around the gear shaft 520, and in that the housing member 400 further includes a hinge member 500 for accommodating the gear 510 and the gear shaft 520 and connecting the two divided units. The gear 510 of one of the two units and the gear 510 of the other one mesh with each other.

In the flexible display device according to the second embodiment of the present disclosure, the support frames 450 may be arranged in the folding region FR so as to be symmetrical to each other on the basis of the hinge member 500 in order to support the lower plate 200 and the second magnetic bodies 300*b*, and the base panel 400*a* of the housing member 400 may be formed at an incline so as to be disposed in the remaining space, other than the space occupied by the hinge member 500.

Each of the first and second magnetic bodies 300*a* and 300*b* is provided in a corresponding one of the non-folding region UFR and the folding region FR of the magnetic body group 300. Particularly, there are provided two second magnetic bodies 300*b*, which are arranged symmetrical to each other on the basis of the hinge member 500 and are adhered to the lower plate 200.

The second magnetic bodies 330*b* provided in the folding region FR are supported by the support frames 450, which are located to the left and right of the hinge member 400. The first magnetic body 300*a* provided in the non-folding region UFR is supported by a support portion 470 protruding from the housing member 400.

Except for the provision of the hinge member 500, the housing member in the second embodiment has a configuration similar to the configuration of the housing member in the first embodiment in terms of the formation of segments (i.e., two support frames 450).

In the second embodiment, the folding region FR of the magnetic body group 300 and the non-folding region UFR of the magnetic body group 300 are individually adhered to the lower plate 200. Upon the folding operation, the folding region FR of the magnetic body group 300 is brought into at least line contact with the lower plate 200 in the folding-axis direction. Regardless of whether a folding or unfolding operation is being performed, the non-folding region UFR of the magnetic body group 300 is kept in surface contact with the lower plate 200. Therefore, the lower plate 200 and the magnetic body group 300 are kept in contact with each other without any adhesive member therebetween.

As a result, the flexible display device according to the second embodiment may exhibit effects that are the same as the aforementioned effects of the flexible display device according to the first embodiment.

Figure 14:
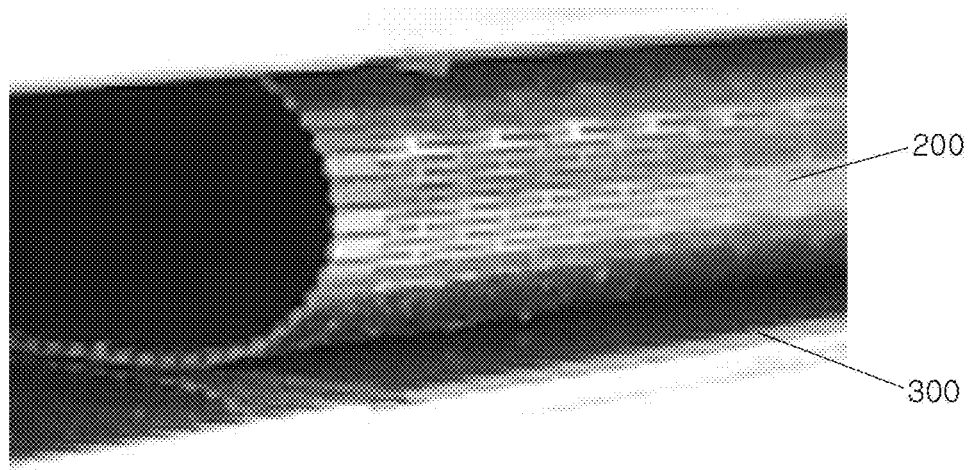
FIG. 14 is a picture showing the lower plate in the folded state in the flexible display device according to the present disclosure.
Figure 15:
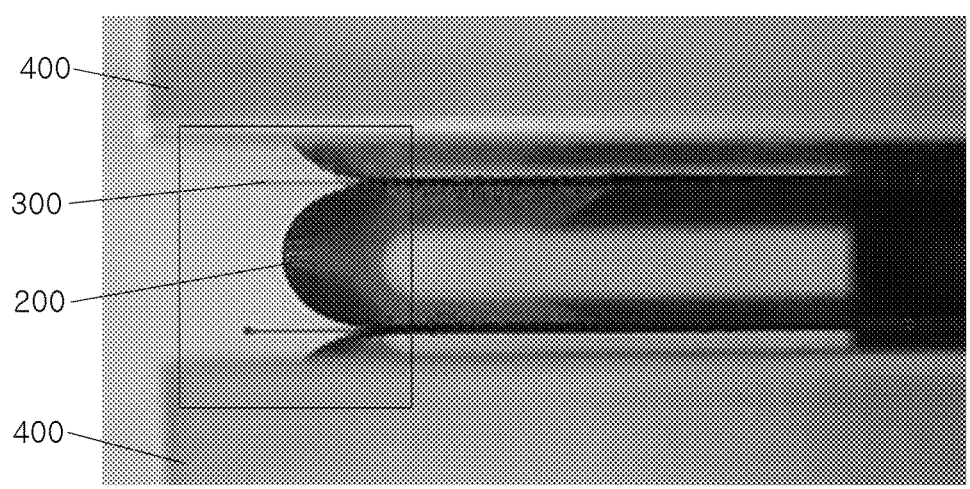
FIG. 15 is a picture showing the folded state in which the lower plate and the magnetic body are partially separated from each other in the flexible display device according to the present disclosure.

FIG. 14 is a picture showing the lower plate in the folded state in the flexible display device according to the present disclosure. FIG. 15 is a picture showing the folded state in which the lower plate and the magnetic body are partially separated from each other in the flexible display device according to the present disclosure.

FIGS. 14 and 15 show the folded state in which the magnetic body group 300 having certain stiffness is separated from the folding region FR of the lower plate 200, which is bent with a certain curvature. In the pictures of FIGS. 14 and 15, only the housing member 400, which is divided into two units in the folding region FR, and the magnetic body group 300 disposed so as to correspond to the housing member 400 are shown, but the hinge member 500 and a portion of the magnetic body group 300 that is located at the folded portion are omitted. As shown in the pictures, the magnetic body group 300 is formed only in a plate shape in the non-folding region, and thus the magnetic body group 300 remains flat upon the folding operation due to the difference in stiffness between the magnetic body group 300 and the lower plate 200, whereby the folding region of the magnetic body group 300 is partially separated from the lower plate 200.

In the pictures, only the difference in stiffness between the lower plate 200 and the magnetic body group 300 is shown. However, in the flexible display devices according to the first and second embodiments, the magnetic body group 300 includes a plurality of second magnetic bodies 300*b* provided in the folding region thereof, and the housing member 400 includes a plurality of segments provided in the folding region thereof, whereby the magnetic body group 300 (300*b*) is kept in at least line contact with the lower plate 200 in the folding region upon the folding operation.

FIG. 16 is a cross-sectional view of a bendable display device according to the present disclosure.

As shown in FIG. 16, the bendable display device according to the present disclosure may be divided into a non-bending region UBR, which corresponds to the center portion of the device, and bending regions BR, which correspond to the left and right portions of the device. FIG. 16 illustrates the bent state of the bending regions BR. In the unbent state, a plate group 2000 in each of the bending regions BR is maintained flat, like the non-bending region UBR.

The non-bending region UBR is maintained flat regardless of whether a bending or unbending operation is being performed. The bending regions BR may be bent with a predetermined curvature at the left and right sides of the device.

The plate group 2000 shown in FIG. 16 is an assembly of the display panel 100 and the lower plate 200, which are stacked on each other. The plate group 2000 is flat and flexible.

The display panel 100 and the lower plate 200 may be configured as described above, and a description thereof will be omitted.

A magnetic body group 1300 may include a first magnetic body 1300*a* provided in the non-bending region UBR and second magnetic bodies 1300*b* provided in the bending regions BR. One or more second magnetic bodies 1300*b* may be provided in each of the bending regions BR. In the case in which a plurality of second magnetic bodies 1300*b* is provided in each of the bending regions BR, the second magnetic bodies 1300*b* may be changed in width in accordance with the curvature with which each of the bending regions BR is bent. For example, the second magnetic body 1300*b*, which is located at a portion of the bending region BR that is bent with a relatively large curvature, may be reduced in width or may be omitted, and the second magnetic body 1300*b*, which is located at a portion of the bending region BR that is bent with a relatively small curvature, may be increased in width. The first magnetic body 1300*a* provided in the non-bending region UBR may be configured as a single body in order to evenly support the plate group 2000 and maintain the plate group 2000 to be flat.

In the bendable display device according to the present disclosure, the bending regions BR of the magnetic body group 1300 and the non-bending region UBR of the magnetic body group 1300 are individually adhered to the lower plate 200. Upon the bending operation, each of the bending regions BR of the magnetic body group 1300 is brought into at least line contact with the lower plate 200 in a bending-axis direction. Regardless of whether a bending or unbending operation is being performed, the non-bending region UBR of the magnetic body group 1300 is kept in surface contact with the lower plate 200. Therefore, the lower plate 200 and the magnetic body group 1300 (1300*a* and 1300*b*) are kept in contact with each other without any adhesive member therebetween.

Therefore, the bendable display device according to the present disclosure may exhibit effects that are the same as the aforementioned effects of the flexible display devices according to the first and second embodiments.

The bendable display device illustrated in FIG. 16 is configured such that the device is bendable in both directions. However, a bendable display device having only one bendable side is possible. In this case, a plurality of second magnetic bodies 1300b may be provided only in one bending region.

In the flexible display device according to the present disclosure, the magnetic bodies may be arranged so as to prevent deterioration in flexibility of a specific portion that is to be folded with a predetermined curvature. The arrangement of the magnetic bodies may vary in accordance with the arrangement of the folding region or the bending region.

As is apparent from the above description, the flexible display device and the electronic device including the same according to the present disclosure have the following effects.

First, when a display panel is mounted on a housing member, a lower plate, which has a size equal or similar to the size of the display panel, is provided so as to face the surface of the display panel. Therefore, the lower plate, having relatively high stiffness, continues to support the display panel so as to prevent the display panel from drooping or being bent, thereby maintaining the stiffness and consequently improving the reliability of the device in spite of repeated folding and unfolding operations. Further, the portion of the lower plate, which corresponds to the folding region, is formed to have a relatively low density, thereby mitigating the stress that is applied to the folding region.

Second, when the display panel is mounted on the housing member, the lower plate is provided under the display panel, and a magnetic body group is provided under the lower plate so as to be adhered thereto by the force of magnetic attraction. Therefore, no adhesive member is needed between the housing member and the display panel, the materials of which have a large difference in stiffness and physical properties, whereby it is possible to prevent peeling-off of the adhesive member and prevent the display panel from being gradually separated from the housing member due to repeated folding and unfolding operations.

Third, magnetic bodies, which are provided in the folding region of the magnetic body group, are arranged in accordance with segments, which are split in the folding region of the housing member. By providing the magnetic bodies and the segments of the housing member, which are respectively adhered to the magnetic bodies, in the folding region that is to be folded with a large curvature, it is possible to assure the flexibility of the device.

Fourth, the surface of the magnetic body group and the surface of the lower plate, which face each other, are maintained flat, and are therefore kept in surface contact with each other only by the force of magnetic attraction, without an additional protruding portion or fastening portion. Upon the folding operation, the magnetic body is not completely separated from the lower plate in the folding region, but is kept in line contact with or in partial surface contact with the lower plate by the force of magnetic attraction. Upon returning to the unfolded state from the folded state, the entire surface area of the magnetic body is brought into contact with the lower plate by the force of magnetic attraction. Therefore, in spite of repeated folding and unfolding operations, the magnetic body group is not completely separated from the lower plate, and the components are therefore stably accommodated in the housing member.

Fifth, upon the folding and unfolding operations, the display panel and the lower plate are operated together, and the lower plate and the magnetic body group are adhered to each other by the force of magnetic attraction. Therefore, no adhesive member is needed between portions that are separated from each other when the folding operation is repeated. Therefore, it is possible to facilitate a rework process, prevent damage to the display panel, and improve production yield of the device.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display device, comprising:
a display panel;
a lower plate formed of stainless steel, a first surface of the lower plate facing a bottom surface of the display panel, the lower plate including a folding region and a non-folding region adjacent to the folding region, the folding region having a density lower than a density of the non-folding region;
a group of magnetic bodies including a first magnetic body attached to the folding region and a second magnetic body attached to the non-folding region, the magnetic body group contacting with a second surface of the lower plate that is opposite to the first surface; and
a metal film provided on the second surface of the lower plate that faces the magnetic body group, the metal film being brought into direct contact with a magnetic body of the magnetic body group.

2. The flexible display device according to claim 1, wherein the magnetic body group includes a single second magnetic body provided in the non-folding region and at least two first magnetic bodies provided in the folding region and wherein the magnetic body in the non-folding region and the at least two first magnetic bodies are separated from each other.

3. The flexible display device according to claim 2, wherein the second magnetic body provided in the non-folding region and the at least two first magnetic bodies provided in the folding region are kept in surface contact with the lower plate, and
wherein a contact area between the at least two first magnetic bodies provided in the folding region and the lower plate at a folded state is smaller than that at an unfolded state.

4. The flexible display device according to claim 2, wherein the second magnetic body provided in the non-folding region and the at least two first magnetic bodies provided in the folding region have flat surfaces so as to correspond to the lower plate.

5. The flexible display device according to claim 1, further comprising:
an adhesive layer provided between the display panel and the non-folding region of the first surface of the lower plate.

6. The flexible display device according to claim 1, wherein the lower plate comprises a plurality of slits formed in the folding region.

7. The flexible display device according to claim 6, wherein the plurality of slits are arranged in a plurality of rows and a plurality of columns, the rows being parallel to a folding axis, and
wherein the plurality of slits formed in the rows arranged adjacent to each other misalign one another when viewed in a column direction.

8. The flexible display device according to claim 6, wherein at least one of the slits formed in the folding region of the lower plate is formed to a depth that is less than a thickness of the non-folding region of the lower plate.

9. The flexible display device according to claim 2, wherein each of the at least two first magnetic bodies provided in the folding region is configured as a single body that continuously extends along a folding-axis direction.

10. The flexible display device according to claim 1, wherein the second magnetic body of the magnetic body group occupies an area that is more than 10% of an entire area of the non-folding region of the lower plate.

11. The flexible display device according to claim 1, further comprising:
a housing member that accommodates the lower plate and the magnetic body group therein.

12. The flexible display device according to claim 11, wherein the housing member is bonded to a bottom surface of the magnetic body group using an adhesive member.

13. The flexible display device according to claim 11, wherein the housing member includes a plurality of segments provided corresponding to the folding region, the segments each extending in a folding-axis direction, and
wherein the first magnetic bodies of the magnetic body group are arranged in accordance with the segments.

14. The flexible display device according to claim 11, further comprising:
a board provided between the magnetic body group and the housing member, the board corresponding to the non-folding region.

15. The flexible display device according to claim 1, wherein the magnetic bodies of the magnetic body group are formed of magnet steel.

16. The flexible display device according to claim 11, further comprising:
a flexible printed circuit board connected to one side of the display panel, the flexible printed circuit board extending so as to be folded between the housing member and the magnetic body group;
a printed circuit board connected with the flexible printed circuit board; and
a battery connected with the printed circuit board, the battery being located between the housing member and the magnetic body group.

17. The flexible display device according to claim 1, wherein the display panel comprises:
a flexible base substrate;
a thin-film transistor array provided on the flexible base substrate;
an organic light-emitting diode array connected with the thin-film transistor array;
an encapsulation layer for encapsulating the organic light-emitting diode array;
a touch electrode array provided on the encapsulation layer; and
a cover layer for protecting the touch electrode array.

18. An electronic device, comprising:
a display panel;
a lower plate formed of stainless steel, a first surface of the lower plate facing a bottom surface of the display panel, the lower plate including a folding region and a non-folding region adjacent to the folding region, the folding region having a density lower than a density of the non-folding region;
a group of magnetic bodies attached to the folding region and the non-folding region, the magnetic body group contacting with a second surface of the lower plate that is opposite to the first surface;
a metal film provided on the second surface of the lower plate that faces the magnetic body group, the metal film being brought into direct contact with a magnetic body of the magnetic body group;
a housing member that accommodates the lower plate and the magnetic body group therein, the housing member including separate portions corresponding to the non-folding region and the folding region, the separate portions each independently movable in accordance with the corresponding non-folding region or folding region;
a flexible printed circuit board connected to one side of the display panel, the flexible printed circuit board extending so as to be folded between the housing member and the magnetic body group;
a printed circuit board connected with the flexible printed circuit board, the printed circuit board being located between the housing member and the magnetic body group; and
a battery connected with the printed circuit board, the battery being located between the housing member and the magnetic body group.

* * * * *